(12) United States Patent
Hamilton et al.

(10) Patent No.: US 6,442,074 B1
(45) Date of Patent: Aug. 27, 2002

(54) TAILORED ERASE METHOD USING HIGHER PROGRAM VT AND HIGHER NEGATIVE GATE ERASE

(75) Inventors: Darlene G. Hamilton, San Jose; Kulachet Tanpairoj, Palo Alto; Ravi Sunkavalli, Santa Clara; Narbeh Derhacobian, Belmont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/795,854

(22) Filed: Feb. 28, 2001

(51) Int. Cl.$^7$ .......................... G11C 16/04; G11C 16/06
(52) U.S. Cl. ................ 365/185.29; 365/185.03; 365/185.22; 365/185.24; 365/185.28; 365/185.3
(58) Field of Search ................ 365/185.03, 185.22, 365/185.24, 185.28, 185.29, 185.33, 185.3

(56) References Cited

U.S. PATENT DOCUMENTS

| | | | |
|---|---|---|---|
| 5,126,808 A | 6/1992 | Montalvo et al. | |
| 5,561,620 A | 10/1996 | Chen et al. | |
| 5,598,369 A | 1/1997 | Chen et al. | |
| 5,675,537 A | 10/1997 | Bill et al. | |
| 5,793,079 A | 8/1998 | Georgescu et al. | |
| 5,793,249 A | 8/1998 | Chen et al. | |
| 5,815,439 A | 9/1998 | Korsh et al. | |
| 5,822,252 A | * 10/1998 | Lee et al. | 365/185.23 |
| 5,875,128 A | 2/1999 | Ishizuka | |
| 5,963,477 A | 10/1999 | Hung | |
| 5,991,206 A | 11/1999 | Shin | |
| 6,011,725 A | 1/2000 | Eitan | |
| 6,043,530 A | 3/2000 | Chang | |
| 6,314,026 B1 | * 11/2001 | Satoh et al. | 365/185.03 |

* cited by examiner

*Primary Examiner*—Son Mai
(74) *Attorney, Agent, or Firm*—Amin & Turocy, LLP

(57) ABSTRACT

A method and system for programming and erasing the normal bits of a memory array of dual bit memory cells is accomplished by programming at a substantially high delta VT and an erase pulse that provides a substantially high electric field to each I/O in a sector one at a time. After the first erase pulse, the erase verify routine is performed on all the IO's together. The substantially higher VT assures that the memory array will maintain programmed data and erase data consistently after higher temperature stresses and/or customer operation over substantial periods of time. This erase pulse that provides a substantially high electric field is selected to erase band to band currents for the entire array that are larger than can be supplied by drain pumps.

56 Claims, 19 Drawing Sheets

TAILORED ERASE METHOD USING HIGHER PROGRAM VT AND HIGHER NEGATIVE GATE ERASE

FIELD OF INVENTION

The present invention relates generally to memory systems and in particular to systems and methods for programming, erasing and verifying sectors of bits in an electronic flash memory device having dual bit memory transistor cells operating in a single bit mode.

BACKGROUND OF THE INVENTION

Flash memory is a type of electronic memory media which can be rewritten and hold its content without power. Flash memory devices generally have life spans from 100K to 300K write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in place, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal connected to a different word line, while all the flash cells in the array have their source terminals connected to a common source terminal. In operation, individual flash cells are addressed via the respective bit line and word line using peripheral decoder and control circuitry for programming (writing), reading or erasing functions.

Such a single bit stacked gate flash memory cell is programmed by applying a voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a voltage is applied to the source, and the control gate is held at a negative potential, while the drain is allowed to float. Under these conditions, an electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. The conventional programming and erase verification methods employed with single bit stacked gate architectures are not adequate for such dual bit devices. Recently, dual bit flash memory structures have been introduced that do not utilize a floating gate, such as an ONO flash memory device that employs a polysilicon layer over the ONO layer for providing wordline connections. Conventional techniques do not address the characteristics associated with these types of devices. Therefore, there is an unmet need in the art for new and improved programming methods and erase verification methods and systems, which ensure proper programming and erasure of data bits in a dual bit memory architecture, and which account for the structural characteristics thereof.

SUMMARY OF THE INVENTION

A system and methodology is provided for verifying erasure of one or more dual bit cells in a memory device, such as a flash memory, operating in a single bit mode. The invention allows for efficient and thorough erasure verification, which minimizes data retention and over-erase issues particular to the ONO dual bit cell architecture operated in the single bit mode. The invention provides significant advantages when employed in association with dual bit memory cells (e.g., an ONO architecture) wherein only one bit thereof is actively used for data storage and visible to the customer. However, it will be recognized that the invention finds utility in association with dual bit memory cell architectures generally, and that the invention is thus not limited to any particular dual bit cell usage implementation or configuration. Although, only a normal bit of a dual memory cell is programmed, residual charge is accumulated into the central region of the cell which cannot be erased by normal erasure of the normal bit. Therefore, the system and methodology includes verifying and erasure of both a normal bit and a complimentary bit of the cell which are opposite sides of the same ONO transistor. The erase pulse of the normal bit is for a longer duration than the complimentary bit, since the erase pulse of the complementary bit is performed to remove only residual charge caused by the programming of the normal bit.

In one aspect of the invention, a system and method is provided for verify erasure of a memory array of dual bit flash memory cells operating in a single bit mode. The system and method include preprogramming of bits in normal bit column locations and then verify erasure of both bits in normal and complimentary bit column locations. The process of erase requires that both the normal and complimentary bits of the same transistor pass the erase verify before moving to the next transistor. Alternatively, the erase verify can be performed on a I/O or word of bits such that the normal bits and complimentary bits of an I/O have to pass before moving on to the next I/O or word. If a bit(s) in a normal bit location is not below a maximum VT defining a blank state, an erase pulse is applied to bits in normal column locations for a specified duration. A verify erasure is then performed on a bit(s) in a complimentary bit location opposite the previously tested bit(s) in the normal bit location. If the bit(s) in the complementary location is not below a maximum VT defining a blank cell, an erase pulse is applied to the bits in complimentary column locations for a specified duration. The steps of verifying and erasure are repeated until each normal bit and complimentary bit in a sector are below the maximum VT defining a blank cell. The steps are then repeated for each sector.

The normal bits are then evaluated to determine if the bits have been over-erased or fall below a minimum VT defining a blank cell. A soft program pulse is provided for the normal bits if it is determined that bits have been over-erased. The soft program verify should include a low level source voltage to shutoff the leakage from other cells on the same column. The complimentary bits are then evaluated to determine if the bits have been over-erased or fall below a minimum VT defining a blank cell. A soft program pulse is provided for the complimentary bits if it is determined that bits have been over-erased. A second or final routine of verify erasure is performed on both the bits in the normal column locations and the complimentary column locations to assure that the soft program pulse did not cause the bits to rise above the maximum VT defining a blank cell.

In another aspect of the invention, the above system and methodology for performing verify erasure comprises applying an erase pulse that provides a substantially high electric field to each I/O (an I/O being a word of memory such as 8 bits, 16 bits, 32 bits) in a sector one at a time. This operation is important for single power supply devices since the beginning of erase band to band currents for the entire array are larger than can be supplied by drain pumps. For example, an electrical field of greater than 5.0 Megavolts/cm2 ((drain voltage+|gate voltage|)*100/Tox) may be utilized for long term stable erase over cycling. After the first erase pulse, the erase verify routine can be performed on all the IO's together. In one particular example, a Vdrain voltage is selected to be at a substantially high positive voltage (e.g., 5.5–6 Volts) and the value of Vgate voltage is at a substantially high negative voltage (e.g., |Vg|>|–5.5|) where the voltage potential between Vdrain and Vgate is also a substantially high voltage (e.g., Vdiff=11–12 Volts). The above erase voltages were found adequate to provide the high electrical field to ensure adequate erase of the dual bit memory cells over a large number of cycles.

In another aspect of the invention, programming of the normal bits of the memory array are accomplished by programming at a substantially high delta VT (e.g., 2.0–3.0 V). The substantially higher VT assures that the memory array will maintain programmed data and erase data consistently after higher temperature stresses (e.g., 100–250° C.) and/or customer operation over substantial periods of time. Furthermore, by utilizing substantially high gate and drain voltages during programming (e.g., Vgate=9.5–10.0 V and Vdrain=5.5–6.0 V), programming times are kept short (e.g., 1 microsecond) without degrading charge loss. A methodology is provided that determines the charge loss for single bit operation during program and erase cycles (e.g., 100K PE cycles). The charge losses over cycling and stress are then utilized to determine an appropriate delta VT to be programmed into a command logic and state machine. The combination of the new erase methodology, programming methodology and correctly selected delta VT facilitate control of the charge loss.

In yet another aspect of the invention, the above discussed substantially higher delta VT and gate and drain voltages are employed in a program and erase cycle. The program and erase cycle performs verify erasure by first programming the normal bits of the dual bit array utilizing the substantially higher delta VT and applying an erase pulse that provides a substantially high electric field to each I/O in a sector one at a time. After the first erase pulse, the erase verify routine is performed on all the IO's together.

In another aspect of the invention, dummy wordlines are provided between gaps of blocks of memory cells to compensate for higher charge loss at higher stress temperatures exhibited at edge wordlines of blocks of memory cells having large gaps.

Other methods include reducing the width of the edge wordlines, reducing the nitride thickness to make it less conducting in high temperatures or using different nitride types with less conductance in high temperatures. The dummy wordlines are typically ignored in normal operations on the memory.

In yet another aspect of the invention, dummy columns of memory cells formed during fabrication outside edge columns are connected to the actual used memory cells of sectors or the like. The columns of dummy memory cells are compensated by floating the dummy memory cells during normal programming and erase cycles, or alternatively, by programming and erasing the dummy memory cells along with the actual used memory cells in the sector. By treating the dummy memory cells similar to the actual used cells, charge that leaks into the dummy cells during fabrication and normal operation that has deleterious effects at higher stress temperatures and/or due to the longevity of customer operation is substantially eliminated.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
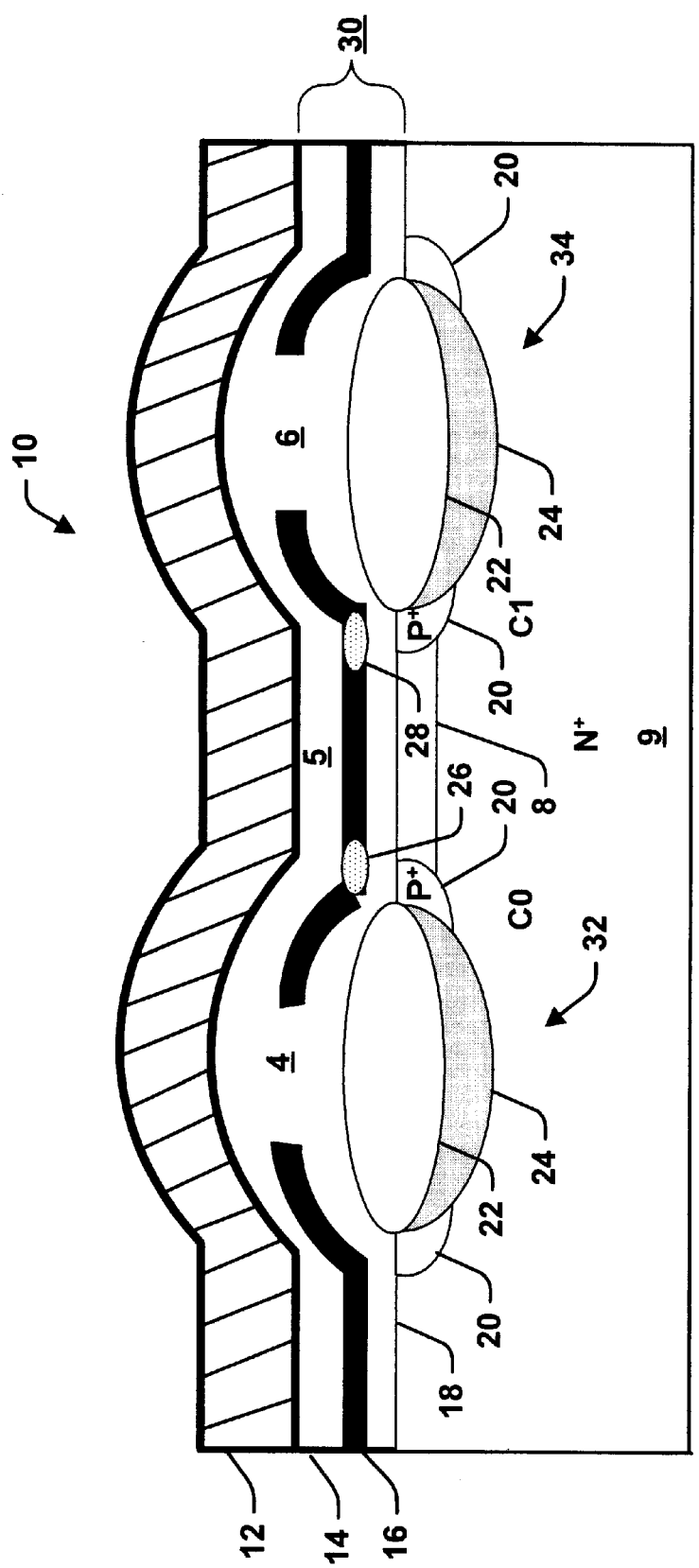
FIG. 1 is a side cross-sectional view of an exemplary dual bit memory cell in which various aspects of the present invention may be implemented.

The following is a detailed description of the present invention made in conjunction with the attached figures, wherein like reference numerals will refer to like elements throughout. The invention provides methodologies and a system for programming (writing), verifying (reading) and proper erasure of dual bit memory cells operating in a single bit mode. The present invention may be used in conjunction with a chip erase or sector erase operation in a flash memory device. Furthermore, the present invention provides methodologies and a system for proper arrangement and maintenance of dual bit memory cells in an array operating in single bit mode. Although the invention is hereinafter illustrated and described in association with an ONO dual bit memory cell architecture wherein only one bit of each cell is used for data storage, it will be appreciated that the invention is applicable to other type architectures and other dual bit architecture usage schemes.

Referring now to the drawings, FIG. 1 illustrates an exemplary dual bit memory cell 10 in which one or more of the various aspects of the invention may be carried out. The memory cell 10 comprises a silicon nitride layer 16 sandwiched between a top silicon dioxide layer 14 and a bottom silicon dioxide layer 18 forming an ONO layer 30. A polysilicon layer 12 resides over the ONO layer 30 and provides a wordline connection to the memory cell 10. A first bitline 32 runs underneath the ONO layer 30 under a first region 4 and a second bitline 34 runs underneath the ONO layer 30 under a second region 6. The bitlines 32 and 34 are formed of a conductive portion 24 and an optional oxide portion 22. Boron core implants 20 are provided on both ends of each bitline 32 and 34 where the bitlines meets the bottom silicon dioxide layer 18 or along the entire transistor. The boron core implants are more heavily doped than the P-type substrate and assist in control of the VT of the memory cell 10. The cell 10 resides on a P-type substrate 9 with the conductive portion 24 of the bitlines 32 and 34 being formed from an $N^+$ arsenic implant, such that a channel 8 is formed between across the P-type substrate. The memory cell 10 is comprised of a single transistor having interchangeable source and drain components formed from the $N^+$ arsenic implant portions 24 residing on the P-type substrate region 9 with a gate formed as part of a polysilicon wordline 12.

Although the first and second bitlines 32 and 34 are illustrated with respect to a conductive portion 24 and an optional oxide portion 22, it is appreciated that the bitlines can be formed from a conductive portion only. Furthermore, although the drawing of FIG. 1 illustrates gaps in the silicon nitride layer 16, it is to be appreciated that the silicon nitride layer 16 may be fabricated with out gaps as a single strip or layer.

The silicon nitride layer 16 forms a charge trapping layer. Programming of the cell is accomplished by applying voltages to the drain and the gate and grounding the source. The voltages generate electrical fields along the channel causing electrons to accelerate and jump from the substrate layer 9 into the nitride which is known as hot electron injection. Since the electrons gain the most energy at the drain, these electrons become trapped and remain stored in the nitride layer near the drain. The cell 10 is generally uniform and the drain and source are interchangeable. Since the silicon nitride is non-conducting, a first charge 26 can be injected into the nitride 16 near a first end of the central region 5 and a second charge 28 can be injected into the nitride 16 near a second end of the central region 5. Therefore, if the charge does not move then there can be two bits per cell instead of one bit.

As previously stated, the first charge 26 can be stored in the nitride layer 16 at the first end of the central region 5 and the second charge 28 can be stored at the second end of the central region 5 such that two bits can reside per memory cell 10. The dual bit memory cell 10 is generally symmetrical, thus the drain and the source are interchangeable. Thus, the first bitline 32 may serve as the drain terminal and the second bitline 34 as the source terminal when programming the left bit C0. Likewise, the second bitline 34 may serve as the drain terminal and the first bitline 32 as the source terminal for programming the right bit C1. Table 1 illustrates one particular set of voltage parameters for performing reading, programming and single sided erases of the dual bit memory cell 10 having the first bit C0 and the second bit C1.

TABLE I

| Operation | Cell | Gate | Bitline 0 | Bitline 1 | Comment |
|---|---|---|---|---|---|
| read | C0 | Vcc | 0 v | 1.2 v | complimentary column |
| read | C1 | Vcc | 1.2 v | 0 v | normal column |
| program | C0 | Vpp | 5–6 v | 0 v | hot electron |
| program | C1 | Vpp | 0 v | 5–6 v | hot electron |
| One side - erase | C0 | −3 to −6 v | 5–6 v | Float | hot hole injection |
| One side - erase | C1 | −3 to −6 v | Float | 5–6 v | hot hole injection |

Various implementations of dual bit memory cell architecture may be achieved according to one or more aspects of the present invention. In particular, the invention is applicable to memory devices wherein only one bit in the dual bit cells is used for data or information storage. The inventors of the present invention have found that even where one bit in such a cell is not used for data storage (e.g., bit C0 of cell 10), that programming and/or erasure of the data storage bit (e.g., bit C1) may cause various physical phenomena to occur in the unused bit (e.g., bit C0).

For example, repeated programming of bit C1 of cell 10 may cause charge accumulation in bit C0 and vice versa. Also, repeated application of erase voltage pulses to bit C1 may cause over erasure of bit C0. These phenomena in the unused bit C0 may in turn cause degradation with respect to the operation of the bit used for data storage (e.g., the ability to effectively read, write/program, and/or erase bit C1). The invention addresses these problems with respect to dual bit memory cell technology by selectively programming, verifying, erasing, and re-verifying the individual bits of such memory cells in order to further ensure the proper erasure of the memory cell, for example, in a block or sector erase operation in a flash memory device.

Figure 2:
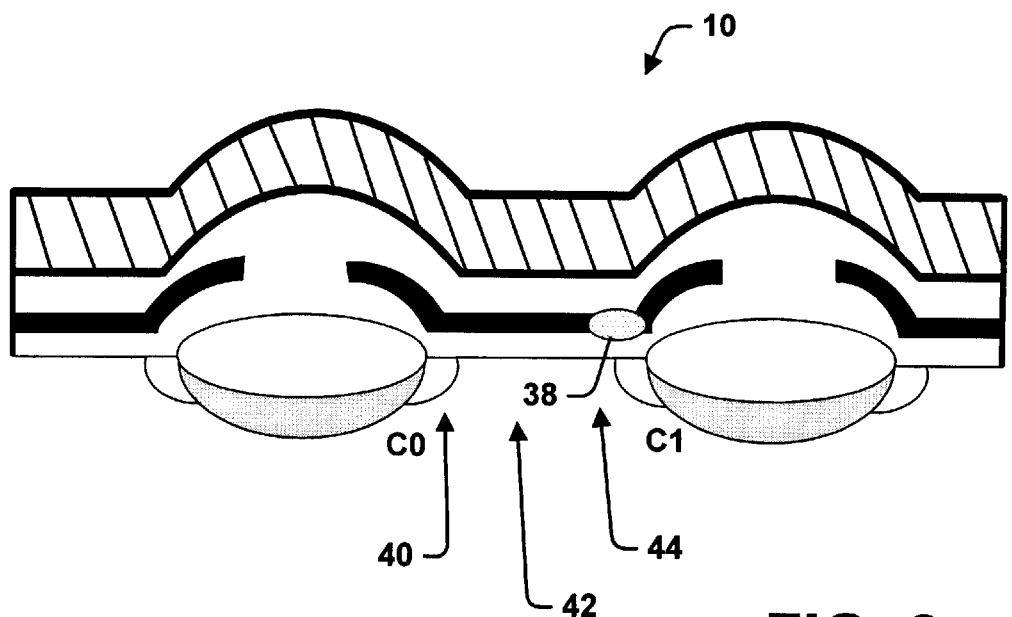
FIG. 2 is a side cross sectional view of the dual bit memory cell illustrating the storing of a programmed charge in a normal region of the dual bit memory cell.

FIG. 2 illustrates the programming of the memory cell 10 in a single bit mode. For purposes of explanation the used bit (e.g., the bit seen by the customer) will be referred to as the normal bit (NB), while the unused bit (e.g., the bit not seen by the customer) will be referred to as the complimentary bit (CB). Single bit operation allows a customer to only see the normal bit during read and write operation. In this situation, the second bitline 34 is the drain and the first bitline 32 is the source during programming, while the first bitline 32 is the drain and the second bitline 34 is the source during a read. During read operations, the junction nearest the cell being read is the ground terminal and the other side of the transistor is the drain. This is called reverse read. The drain is switched during programming and erase back to the nearest junction being the Vdrain voltage instead of ground which is used for read and verify operations.

The dual bit memory cell 10 may be considered as three individual pieces acting together which are a complimentary bit region 40, a central region 42 and a normal bit region 44. The complimentary bit region 40 and the normal bit region 42 are near the drain/source junctions and the local VT can be modified during programming and erase operations. The central region 42 should be close to the natural VT generated in the fabrication process of the memory cell 10. The silicon nitride 16 from the ONO stack 30 is used to store a charge 38 in the normal region 44. Since nitride is not a conductor, the charge added or removed during the program and erase operations should not redistribute itself but should remain where it is originally injected. This means each side of the transistor can have different charge and different VT almost independent of the other side. For example, if the natural or erase/blank VT of the CB and NB is approximately 1.2 V and if the NB is programmed to a VT of approximately 3.8 V, the CB should still be close to the blank state. Furthermore, if both bits are programmed to a VT of 3.8 V and then the NB is erased then the CB should be at approximately 3.8 V and the NB at approximately 1.2 V.

Figure 3:
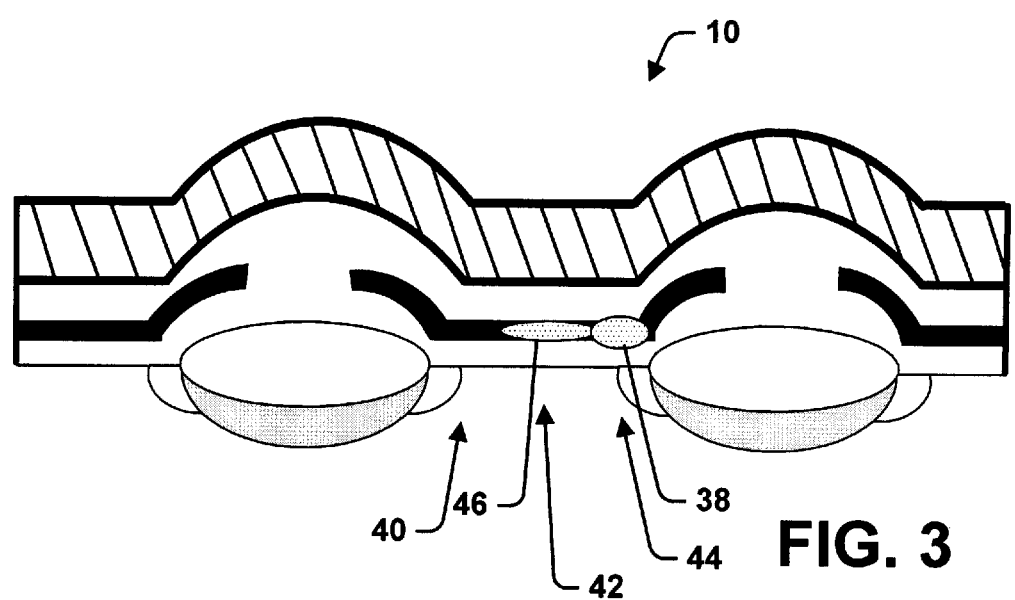
FIG. 3 is a side cross sectional view of the dual bit memory cell illustrating residual charge accumulation into a central region of the cell due to the programmed charge in the normal region of the dual bit memory cell.
Figure 4:
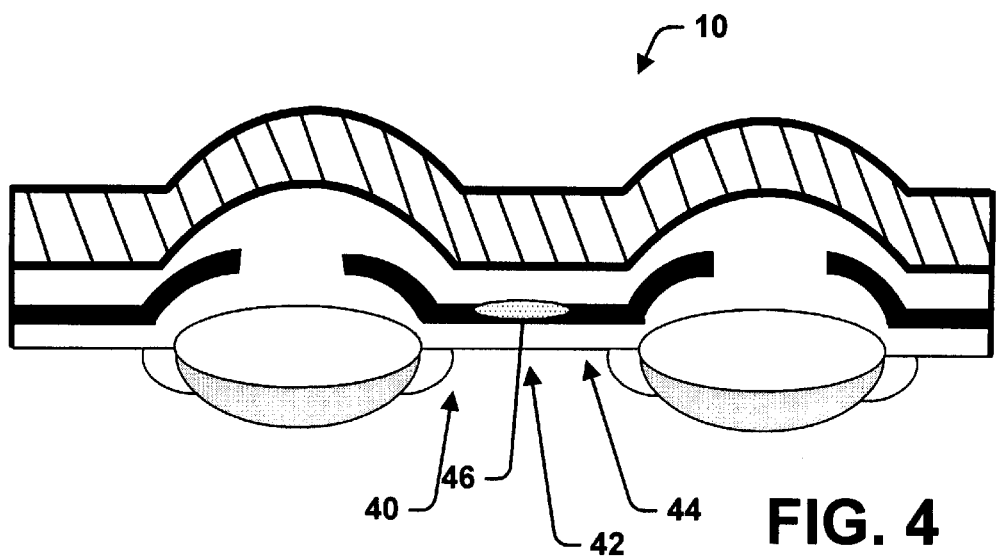
FIG. 4 is a side cross sectional view of the dual bit memory cell illustrating residual charge remaining in the central region of the cell after erasure of the programmed charge in the normal region.

Additionally, during the read operation for the NB, part of the charge near the CB bitline should be covered by a drain depletion region since the source (ground) is always on the junction nearest the cell being verified. This is called reverse read operation since the verified cell's junction is grounded. Although, the reverse read method covers up some of the charge near the other bits's junction, any charge in the center of the channel will modify the effective VT of both the CB and the NB. As one of the areas becomes higher or lower in VT, the other regions can also be effected since they are all part of the same transistor. FIG. 3 illustrates how programming the programming charge 38 into the NB region can cause a buildup of charge 46 to escape into the central region 42 over one or more programming and erase cycles. Eventually, the buildup of residual or leakage charge 46 cannot be reached during a normal erase cycle of the NB as illustrated in FIG. 4. This build up of residual charge 46 can changes the effective VT of the NB region 44 and cause the erase time to increase as the number of program and erase cycles increase.

Figure 5:
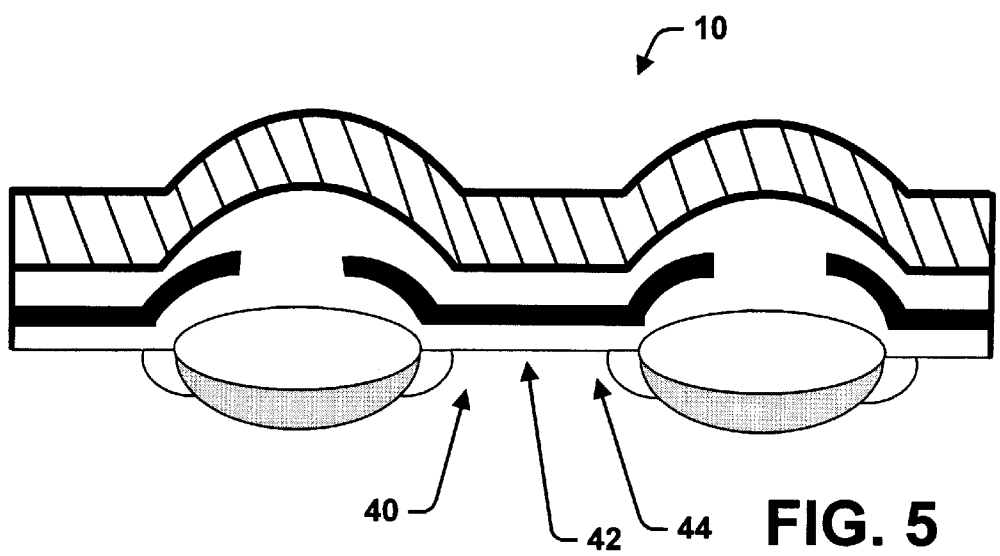
FIG. 5 is a side cross sectional view of the dual bit memory cell illustrating removal of the residual charge remaining in the central region of the cell after erasure of a complimentary region of the dual bit memory cell.

Therefore, in single bit operation, it is important to make sure that the VT of the NB region 40, the central region 42 and the CB region 44 are monitored and maintained at known levels in order to operate the memory cell correctly. Typically, the process of monitoring and controlling the VT of the CB and NB occurs during erase (hereinafter referred to as "the tailored erase"). Therefore, an erase must also be performed on the CB to ensure that the residual charge in the central region 42 is controlled. By controlling the VT distributions during erase, both the erase and program times remain stable during program and erase cycling. FIG. 5 illustrates the memory cell 10 after a programming and erase cycle of the NB employing the tailor erase methodology of the present invention.

Many flash memories are provided with command logic and embedded state machines which perform the complex programming and erasing operations automatically. A static random access memory (SRAM) module component may include the programs implemented by a micro-controller for use in controlling the operations of command logic and the memory system. These programs are typically loaded into an SRAM when a system is powered up. A bus can be used to send control commands from a processor to the command logic device and to exchange the data read from or written to the flash memory device with the command logic and a host processor. The embedded state machines of the flash device generate the command logic controls for detailed operations such as the various individual steps necessary for carrying out programming, reading and erasing operations. The state machine thus functions to reduce the overhead required of a processor (not depicted) typically used in association with a microchip containing the flash memory.

Figure 6:
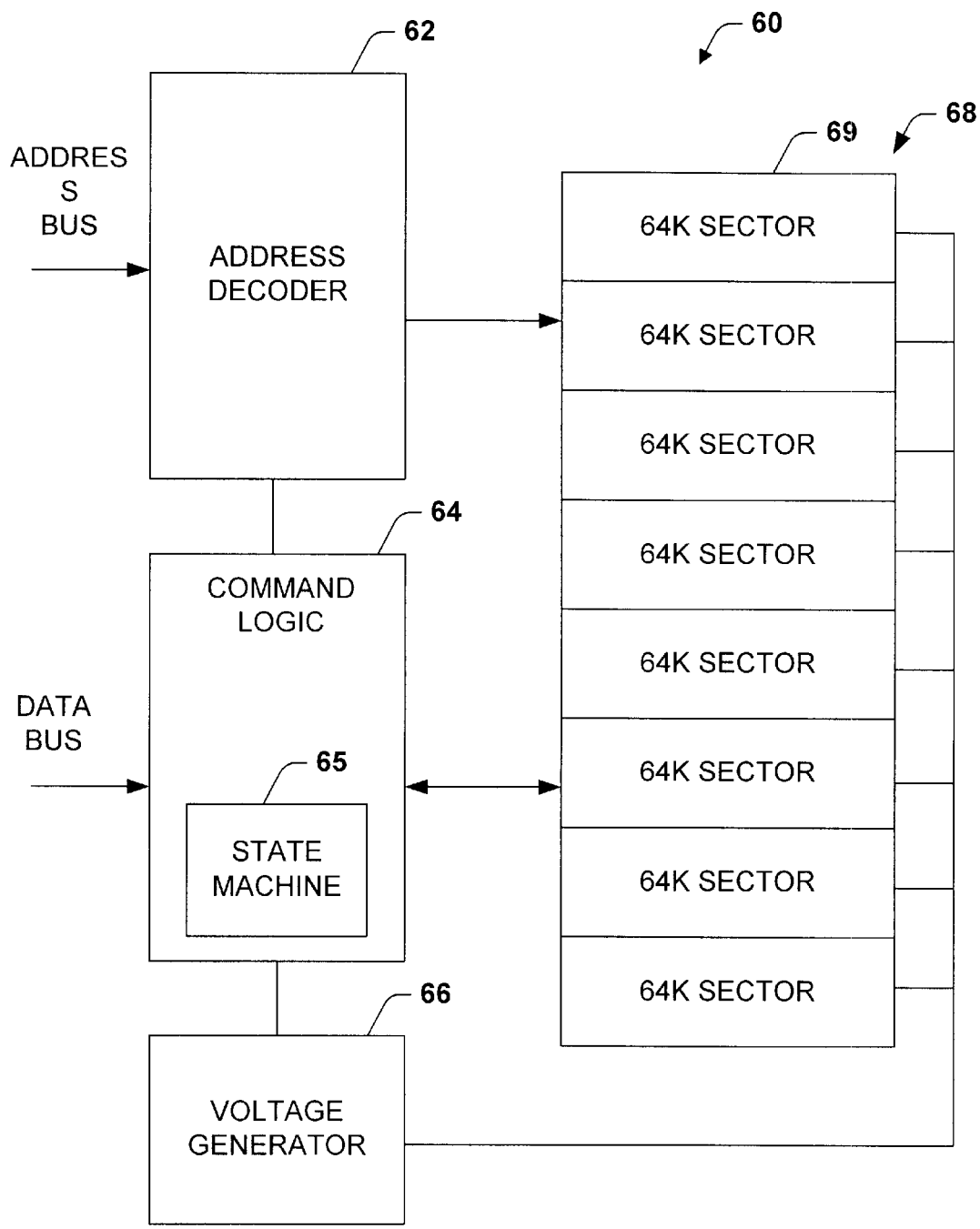
FIG. 6 illustrates a block schematic diagram of a system adapted to carry out various aspects of the invention.

Referring now to FIG. 6, a system 60 is provided for performing programming, verifying, soft programming and erasing of a memory array 68 employing the dual bit memory cells of the present invention. In the present example, the memory array 68 is comprised of a plurality of 64K sectors 69. A sector of the flash memory array 69 includes a portion of the memory array 68 consisting of all the memory cells grouped together via all the wordlines that share the same sector address. The sector address is typically the n (e.g., six) most significant address bits of the address bit signals used to address one or more cells in the memory device where n is an integer. For example, each 64K sector 69 can be comprised of 8 IOs where an IO is a row of 8 cells or 8 dual bit memory cells having 8 normal bits and 8 complimentary bits operating in single bit mode. It is to be appreciated that the memory array 68 could be any number of different configurations, for example, 128K sectors comprised of 16 normal bits and 16 complimentary bits on 16 cells. In addition any number of sectors may be employed only limited by the size of the application and the size of the device employing the flash memory array 68.

The system 60 includes an address decoder 62 connected to the flash memory array 68 for decoding IOs during various operations that are performed on the array 68 (e.g., programming, reading, verifying, erasing). The address decoder receives address bus information from a system controller (not shown) or the like.

A command logic component 64 includes an internal state machine 65. The command logic component 64 is connected to the address memory array 68. The command logic and state machine receive commands or instructions from a databus connected to a system controller or the like. The commands or instructions invoke algorithms embedded in the command logic 64 and state machine 65. The algorithms perform the various methodologies of programming, reading, erasing, soft programming and verifying to be described herein. A voltage generator component 66 is also connected to the memory array 68 and the command logic 64 and state machine 65. The voltage generator component 66 is controlled by the command logic 64 and state machine 65. The voltage generator component 66 is operable to generate the necessary voltages for programming, reading, erasing, soft programming and verifying of the memory cells of the memory array 68.

Figure 7:
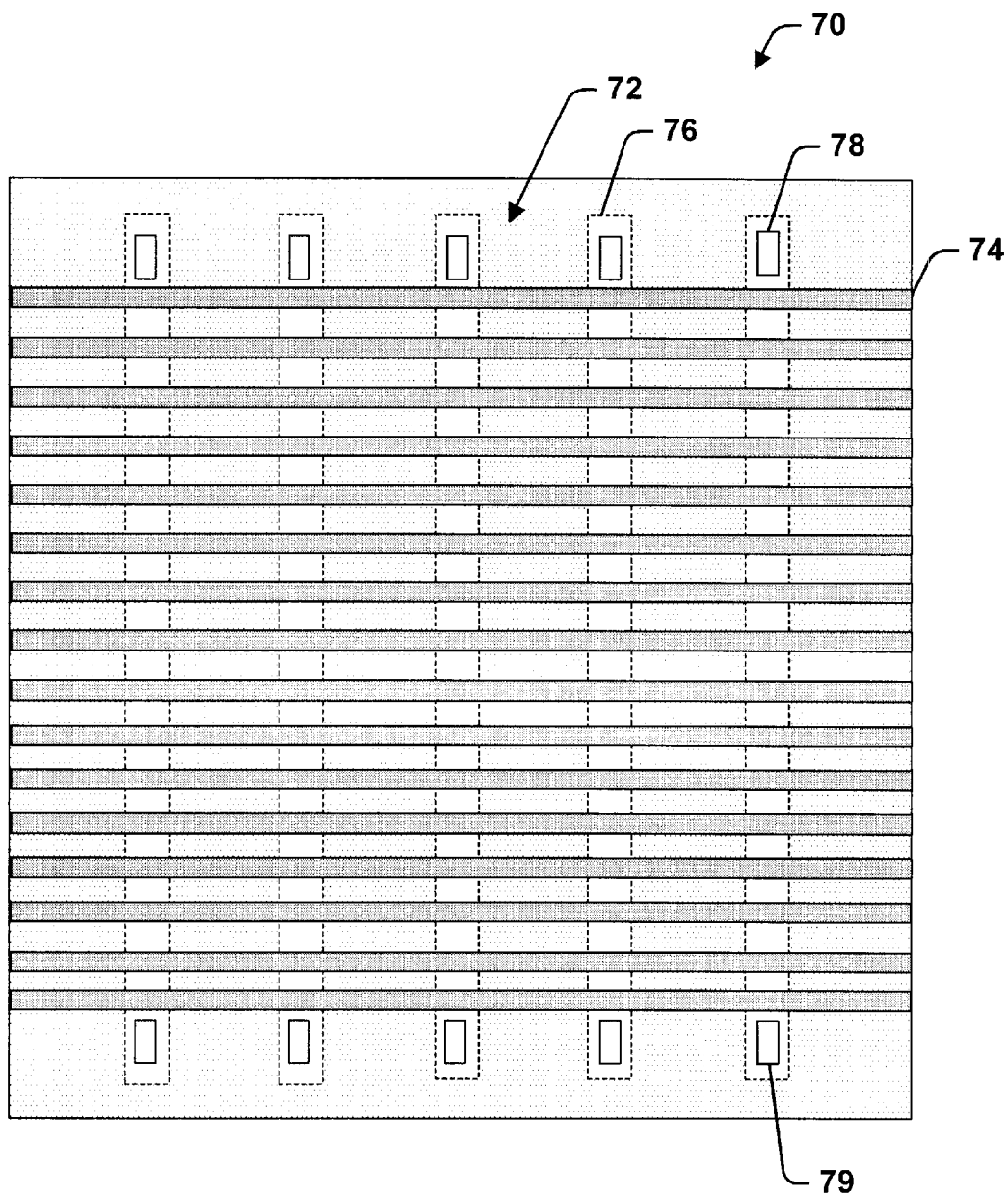
FIG. 7 illustrates a partial top view of a 64K sector of an array of dual bit flash memory having 16 words of 8 bit memory when operating in a single bit mode in accordance with the present invention.

FIG. 7 illustrates a partial memory cell layout from a top or plan view of an example of a 64K block 70. The present example is illustrated with respect to a 64K block of 8 bit I/Os. It is to be appreciated that blocks may be 16 bit, 32 bit, 64 bit or more I/Os and are not limited to 64K (e.g., 128K, 256K, etc.). The 64K block 70 can be a sector or a portion of a sector. For example, one or more blocks with the contacts connecting common metal bitlines can form a sector. An ONO stack strip or layer 72 extends the length of the memory array and includes the block 70. The block 70 includes 16 I/Os or groups of columns 79. Each "word" or group of IO's is comprised of eight transistors or eight normal bits and eight complimentary bits. The eight normal bits are seen by the customer and each I/O includes a polysilicon wordline 74 for addressing the rows of cells. A plurality of bit lines run underneath the ONO stack strip layer 72 for enabling reading, writing and erasing of individual bits of the memory cells. Each bitline is connected to a first contact 78 and metal bitlines (not shown) at one end of a group of sixteen rows and a second contact 79 at the other end of the group. In the example of FIG. 7, five bit lines are illustrated such that a bitline is tied to an end of every other transistor in a column and two select transitors are used to select between four bits of two transistors for reading, writing and erasing.

Figure 8:
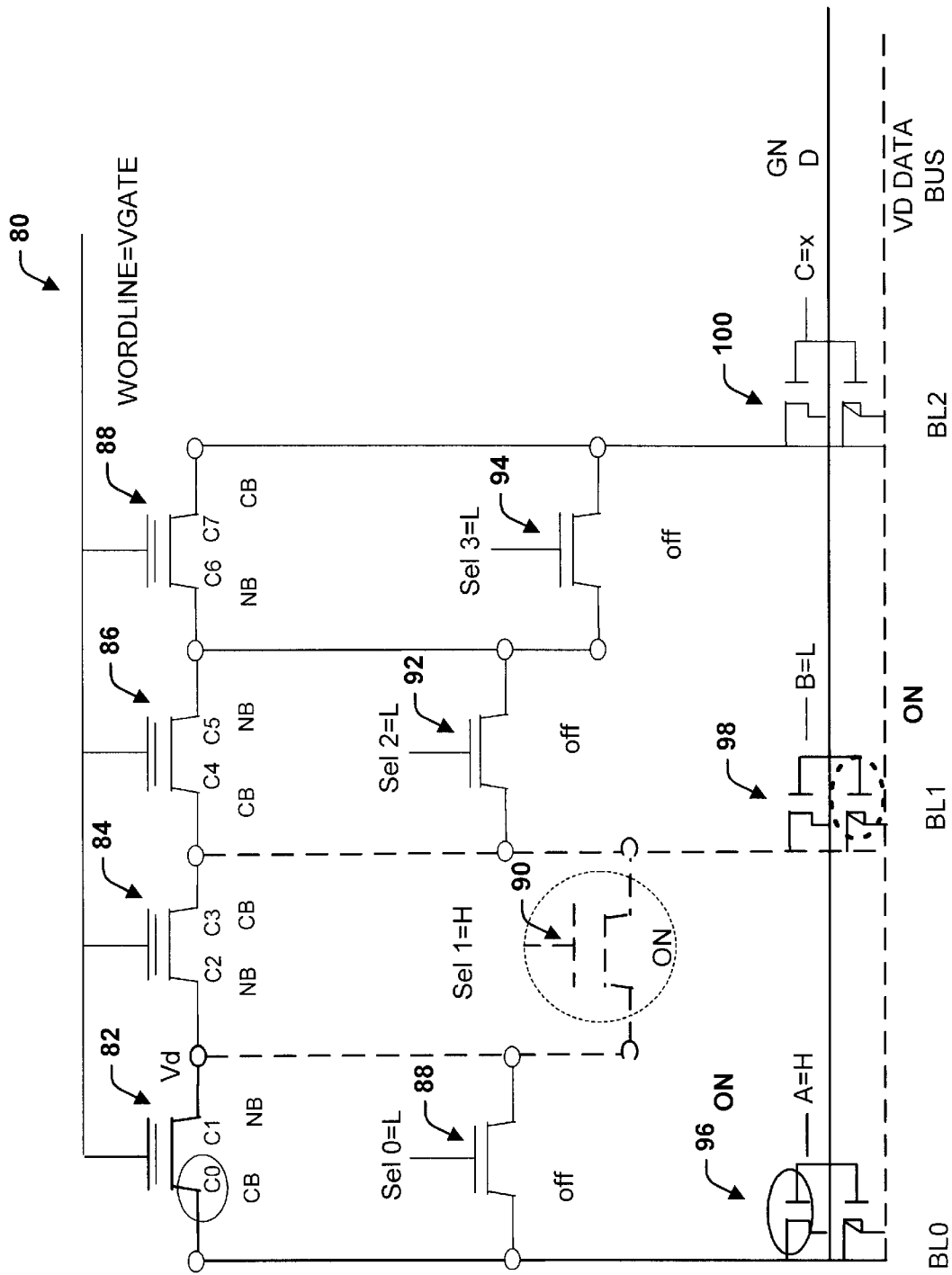
FIG. 8 illustrates a schematic view of a portion of a row of dual bit memory cells in accordance with the present invention.

FIG. 8 illustrates a schematic diagram of addressing of the first four dual bit memory cells in a row utilizing selection transistors and three bitlines for reading, writing and erasing bits. A first dual bit memory cell 82 includes a first bit C0 and a second bit C1, a second dual bit memory cell 84 includes a first bit C2 and a second bit C3, a third dual bit memory cell 86 includes a first bit C4 and a second bit C5 and a fourth dual bit memory cell 88 includes a first bit C6 and a second bit C7. In double bit mode the four dual bit memory cells could form a 8-bit word, while in single bit mode the four dual bit memory cells only form half of the same 8-bit word. In single bit mode, bits C0, C3, C4 and C7 are complimentary bits and bits C1, C2, C5 and C6 are normal bits. A select gate 88 (Sel0) and a select gate 90 (Sel1) are provided to enable reading, writing and erasing of the bits C0, C1 of dual bit memory 82 and bits C2 and C3 of dual bit memory 84. A select gate 92 (Sel2) and a select gate 94 (Sel3) are provided to enable reading, writing and erasing of the bits C4, C5 of dual bit memory 86 and bits C6 and C7 of dual bit memory 88. A first switch 96 is connected to a first bitline BL0, a second switch 98 is connected to a second bitline BL1 and a third switch 100 is connected to a third bitline BL2. The first, second and third switches couple the corresponding bitline between power (VDD) and ground (GND). Any bit of the dual bit memory cells can be read by providing different voltage configurations as illustrated in Table 2 below. In the example illustrated in FIG. 8, cell C0 of dual bit memory cell 82 is being read.

TABLE 2

| cell | WL | A | B | C | sel 0 | sel 1 | sel 2 | sel 3 | BL 0 | BL 1 | BL 2 |
|------|-------|---|---|---|-------|-------|-------|-------|------|------|------|
| C0 | Vgate | H | L | x | L | H | L | L | GND | VD | X |
| C1 | Vgate | L | H | x | L | H | L | L | VD | GND | X |

TABLE 2-continued

| cell | WL | A | B | C | sel 0 | sel 1 | sel 2 | sel 3 | BL 0 | BL 1 | BL 2 |
|---|---|---|---|---|---|---|---|---|---|---|---|
| C2 | Vgate | H | L | x | H | L | L | L | GND | VD | X |
| C3 | Vgate | L | H | x | H | L | L | L | VD | GND | X |
| C4 | Vgate | x | H | L | L | L | L | H | X | GND | VD |
| C5 | Vgate | x | L | H | L | L | L | H | X | VD | GND |
| C6 | Vgate | x | H | L | L | L | H | L | X | GND | VD |
| C7 | Vgate | x | L | H | L | L | H | L | X | VD | GND |

Figure 9:
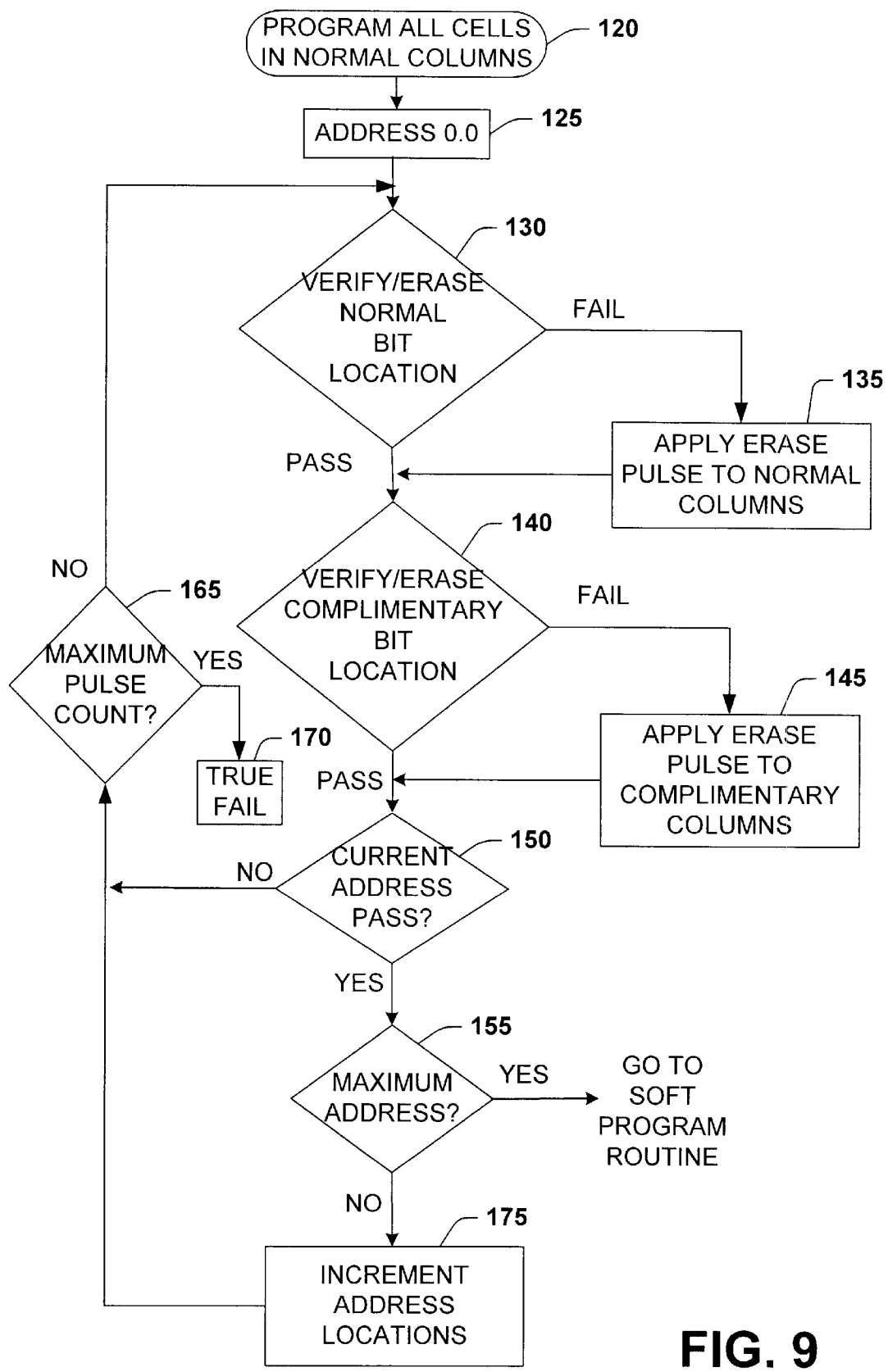
FIG. 9 is a flow diagram illustrating a methodology for erase verifying of an array of dual bit memory cells in accordance with an aspect of the invention.
Figure 10:
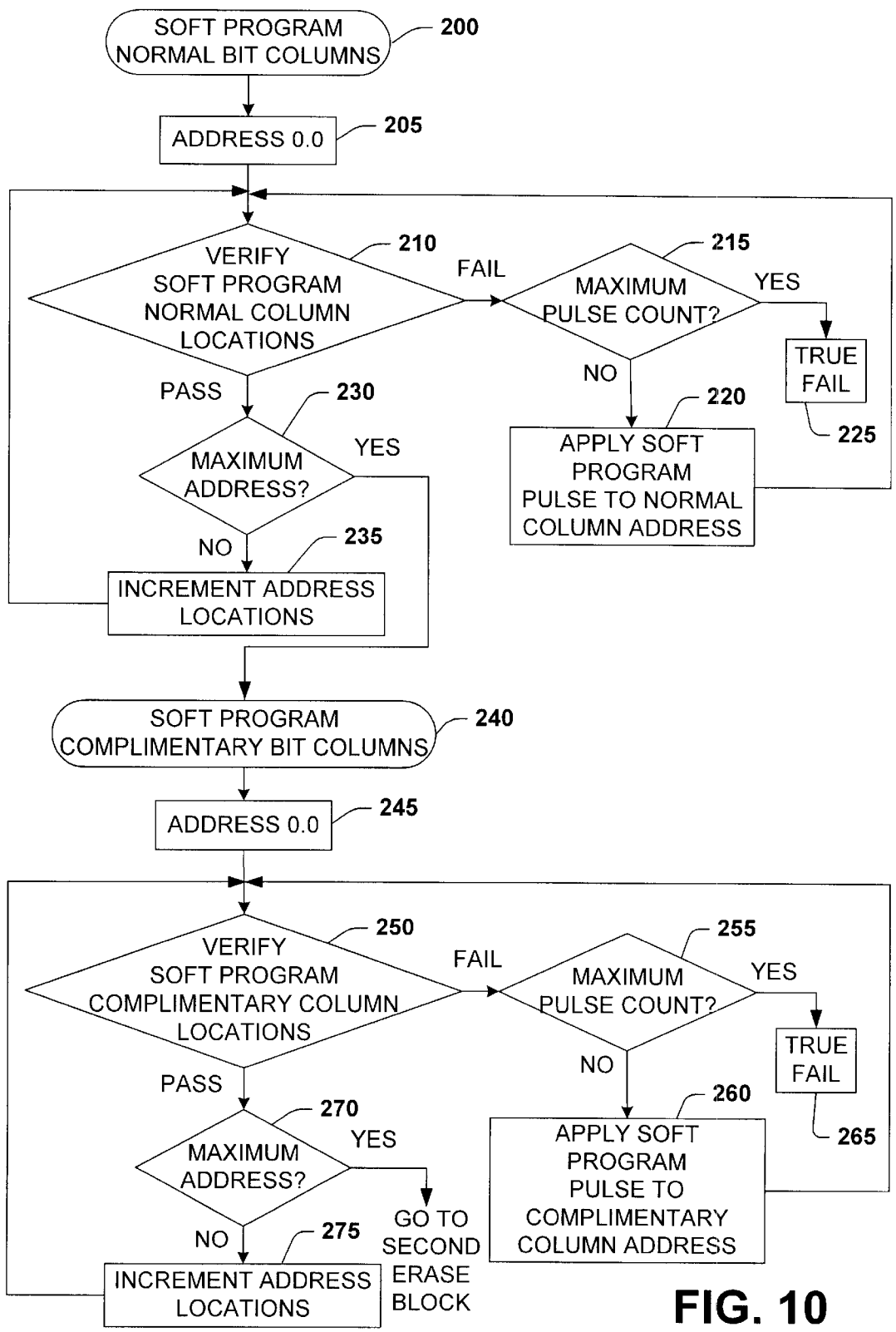
FIG. 10 is a flow diagram illustrating a methodology for soft programming of cells in the array of dual bit memory cells after the erasure verifying method of FIG. 9 in accordance with an aspect of the invention.
Figure 11:
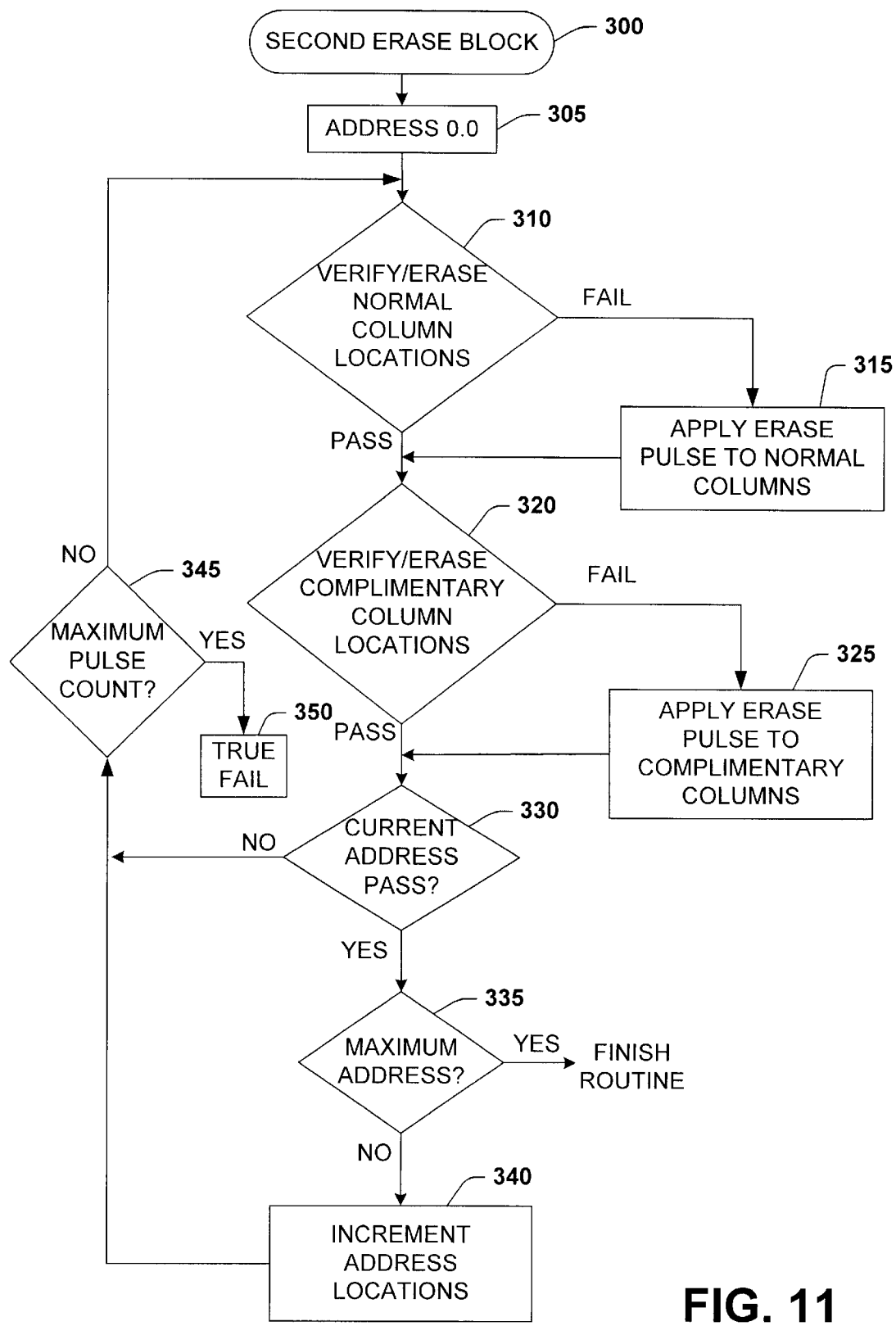
FIG. 11 is a flow diagram illustrating a methodology for verify erasure of cells in the array of dual bit memory cells after the soft programming method of FIG. 10 in accordance with an aspect of the invention.

In view of the structure described above with respect to FIGS. 1–8, a methodology for a tailored erase of dual bit memory cells operating in single bit mode in accordance with one aspect of the present invention may be better appreciated with respect to the flow diagrams of FIGS. 9–11. While, for purposes of simplicity of explanation, the methodology of FIGS. 9–11 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect the present invention. The tailored erase methodology of FIGS. 9–11 includes a cell erase routine to control the upper and lower threshold limit of VT for a blank or erased condition (e.g., min VT=1.0 V, max VT=1.8 V) for both the complimentary and normal sides of each memory transistor. Furthermore, the tailored erase methodology includes a soft programming routine that controls the programming time by preventing over-erase of the cells which can lead to longer programming times. The soft programming can also impact the amount of charge loss after cycling. Finally the tailored erase routine includes a chip block erase to assure that any cells have not been programmed from the soft programming routine. The tailored erase methodology of FIGS. 9–11 improves the program and erase characteristics of the Flash memory array of the present invention operating in single mode during extended cycling (e.g., 100,000 program and erase (PE) cycles).

FIG. 9 illustrates an erase methodology utilizing hot hole injection near the high voltage drain junction. The tailored erase method ensures control of the complimentary bit VT by verification and erase with each cycle, since the process of heavy programming on the normal bit causes a build up of residual charge that cannot be reached during the erase from the normal drain within 10 PE (program and erase) cycles. This residual charge is not near the drain junction and cannot be covered up with a higher Vd during read or verify. This build up of residual charge changes the effective VT of the normal bit and causes the erase time to increase with the number of PE cycles. A high electrical field erase on the complimentary bit in addition to the programmed normal bit removes the residual charge and the erase time returns to normal. An erase verify of the complimentary bit with each PE cycle can detect the buildup of residual charge and a short complimentary side erase pulse can remove the residual charge.

FIG. 9 illustrates one particular methodology for performing a programming and erase of a flash memory array having dual bit memory cells operating in single bit mode in accordance with one aspect of the present invention. The method begins at step 120 were all normal columns are programmed to a delta VT. The method then advances to step 125 where an address counter pointing to the memory address of the array is set to address 0.0. The methodology then proceeds to step 130. At step 130, the method performs a verify erase for a normal bit location in a sector. The normal bit location can be a memory address of a single bit location or a memory address of an I/O or word location of the sector. If the verify erase of a normal bit location fails, the methodology proceeds to step 135 and applies an erase pulse to the normal column locations of the sector for a duration of 8–12 ms (e.g., a 10 ms pulse). If the verify erase of a normal bit location passes or an erase pulse was given, the methodology proceeds to step 140 and performs a verify erase of the associated complimentary bit(s) location. If the verify erase of the complimentary bit(s) fails, the methodology proceeds to step 145 and applies an erase pulse to the complimentary column locations of the sector for a duration of 0.25–2 ms (e.g., a 1 ms pulse).

If the verify erase of the complimentary bit passes, the methodology proceeds to step 150 to determine if the current cell or I/O address has passed. If the current cell or I/O address has not passed (NO), the method proceeds to step 165 to determine if the maximum pulse count (e.g., 6000 pulses to normal bits, 6000 pulses to complimentary bits) has been reached. If the maximum pulse count has not been reached (NO), the method returns to step 130 to repeat the steps of verifying the erase of the normal and complimentary bit location and applying erase pulses if necessary. If the maximum pulse count has been reached (YES), a true failure is indicated in step 170. If the current address has passed at step 150 (YES), the method advances to step 155 to determine if the maximum sector address has been reached. If the maximum sector address has not been reached (NO), the address location of the address counter is incremented to the next address location and the method returns to step 165. If the maximum address has been reached (YES) at step 155, the method advances to the soft program routine in FIG. 10 to ensure that the memory cells have not been over-erased.

A methodology of soft programming is utilized to control the minimum (over-erased) normal and complimentary bit VT's of a blank state after the erase methodology of FIG. 9. Over-erased cells are any VT under the minimum value for a blank state and are not classical column leakage bits. Although, it was not believed possible to store trapped holes in the nitride layer, the electrical fields used to erase the memory cells are very high and the local VT of the cells can be reduced below the natural state. When this occurs, the programming time for the over-erased cells will increase for the normal bit cells. Therefore, the soft programming methodology of FIG. 10 is performed to eliminate over-erased cells and maintain stable programming times during cycling.

FIG. 10 illustrates one particular methodology for performing soft programming of the flash memory array to ensure that the memory cells of the flash memory have not been over-erased. At step 200, the soft programming methodology begins with the normal column soft program block. The method then advances to step 205 where the address counter is set to address 0.0. The methodology then proceeds to step 210. At step 210, the method performs a verify of the soft program normal column locations. The verify should include a slight source voltage to repress any subthreshold leakage currents. If the verify soft program of a normal bit locations fails, the methodology proceeds to step 215 to determine if the maximum pulse count (e.g., 5 pulses) has been reached. If the maximum pulse count has not been reached (NO), the method advances to step 220 to apply a soft program pulse to the normal bit and returns to step 210 to verify if the normal bit has passed soft programming verify condition. If the normal column locations of the sector pass at step 210, the method proceeds to step 230 and determines if the maximum address of the sector has been reached. If the maximum sector address has not been reached (NO), the address location of the address counter is moved to the next sector location at step 235 and the method returns to step 210 to repeat the steps of soft programming verify of the next sector in the memory array. If the all sectors have been erased and the maximum sector address has been reached (YES) at step 230, the method advances to the complimentary column block at step 240.

At step 240, the soft programming methodology begins with the complimentary column soft program block. The method then advances to step 245 where the address counter is set to address 0.0. The methodology then proceeds to step 250. At step 250, the method performs a verify of the soft program complimentary column bit locations. If the verify soft program of a complimentary bit fails, the methodology proceeds to step 255 to determine if the maximum pulse count has been reached. If the maximum pulse count has not been reached (NO), the method advances to step 260 to apply a soft program pulse to the complimentary column locations of the sector and returns to step 250 to verify if the complimentary bit has passed soft programming. If the complimentary column locations of the sector pass at step 250, the method proceeds to step 270 and determines if the maximum address of the sector has been reached. If the maximum sector address has not been reached (NO), the address location of the address counter is moved to the next sector location at step 275 and the method returns to step 250 to repeat the steps of soft programming verify of the next sector in the memory array. If the maximum sector address has been reached (YES) at step 270, the method advances to the second erase block of FIG. 11.

FIG. 11 illustrates one particular methodology for performing a second erase block of the flash memory array to ensure that the soft programming routine did not over program the memory cells in accordance with one aspect of the present invention. The method begins at step 300 at the second erase block. The method then advances to step 305 where the address counter is set to address 0.0. The methodology then proceeds to step 310. At step 310, the method performs a verify erase for a normal bit location in a sector. If the verify erase of a normal bit fails, the methodology proceeds to step 315 and applies an erase pulse to the normal column locations of the sector. If the verify erase of a normal bit location passes or an erase pulse was given, the methodology proceeds to step 320 and performs a verify erase of the associated complimentary bit location. If the verify erase of the complimentary bits fails, the methodology proceeds to step 325 and applies an erase pulse to the complimentary column locations of the sector. If the verify erase of the complimentary bits passes, the methodology proceeds to step 330 to determine if the current sector address has passed. If the current sector address has not passed (NO), the method proceeds to step 345 to determine if the maximum pulse count (e.g., 50 pulses total) has been reached.

It is to be appreciated that the second erase block can be similar to the erase block of FIG. 9 where an erase pulse to the normal column locations of the sector can be applied for a duration of 8–12 ms (e.g., a 10 ms pulse), while an erase pulse to the complimentary column locations of the sector can be applied for a duration of 0.25–2 ms (e.g., a 1 ms pulse). Alternatively, an erase pulse to the normal column locations of the sector and the complimentary column locations of the sector can be applied for a duration of 0.25–2 ms (e.g., a 1 ms pulse).

If the maximum pulse count has not been reached (NO), the method returns to step 310 to repeat the steps of verify the erase of the normal and complimentary column locations and applying erase pulses if necessary. If the maximum pulse count has been reached (YES), a true failure is indicated in step 350. If the current address has passed at step 330 (YES), the method advances to step 335 to determine if the maximum sector address has been reached. If the maximum sector address has not been reached (NO), the address location of the address counter is moved to the next sector location at step 340 and the method returns to step 345. If the all sectors have been erased and the maximum sector address has been reached (YES) at step 335, the method ends.

Figure 12:
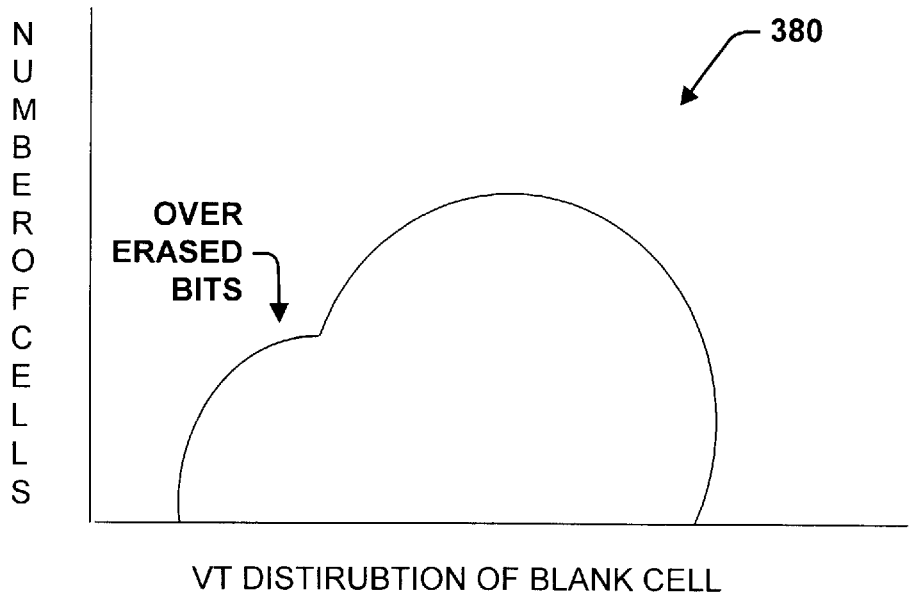
FIG. 12 is a graph illustrating a VT distribution of blank cells versus the number of cells utilizing a classic erasure methodology of the normal bits in accordance with a conventional methodology.
Figure 13:
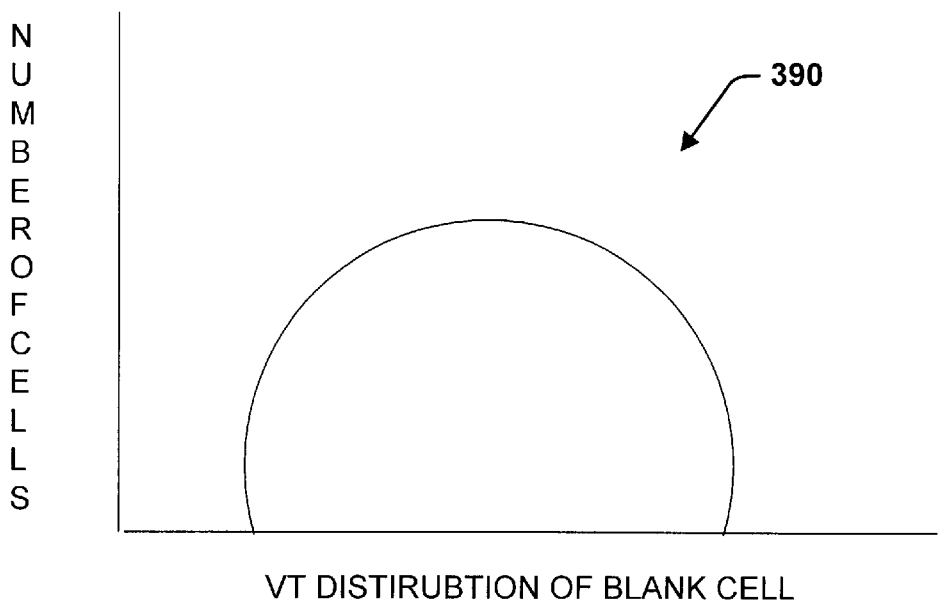
FIG. 13 is a graph illustrating a VT distribution of blank cells versus number of cells utilizing an erasure methodology of the normal bits and complimentary bits in accordance with one aspect of the present invention.

FIG. 12 illustrates a graph 380 of an example of a VT distribution of blank cells versus the number of cells during a normal program and erase operation of the flash memory array having dual bit memory cells operating in the single bit mode without soft programming. As illustrated in the graph 380 a number of cells become over-erased due to the complimentary bit disturb effects. FIG. 13 illustrates a graph 390 of an example of VT distribution of blank cells versus the number of cells after the tailored erase routine of FIGS. 9–11 on a flash memory array having dual bit memory cells operating in the single bit mode. The tailored erase method of FIGS. 9–11 was found to correct cell characteristics for the issues which caused the rapid increases in both program and erase times.

As illustrated in the tailored erase algorithm of FIGS. 9–11, the verify/erase of the normal and complimentary bits are interleaved to compensate for the complimentary bit disturb effect on the erase verify of the normal bit. Performing an erase without interleaving the normal and complimentary bits can lead to over-erase and false verification of the erase state. The erase operation of the two bit memory cell operating in single bit mode is also very sensitive to electrical fields during an erase pulse. The electric field of the erase pulse needs to be strong enough reach into the center of the channel. Lower electrical fields are much less effective for this task. The high electrical fields are needed to generate hot holes for the erase of the two bit memory cell. At the beginning of erase the charge near the drain junction and negative gate voltage causes valence and conduction bands to bend so much that they actually overlap. The overlap of the two bands results in a very large current (i.e., band to band current) as electrons move from the valence to the conduction bands near the drain and ONO layer interface. This large band to band current is key in the generation of the hot holes needed to erase the two bit memory cell.

In the beginning of erase, the band to band current is high (e.g., about 30 mA for a sector worth of cells). It was determined, that the band to band current drops rapidly during the erase process and a 10 ms pulse to each I/O in the sector reduces the band to band current well under 3 mA for the whole sector. The large band to band current at the first erase pulse needs to carefully controlled to prevent over-stress of the product power busses. After the first erase pulse, it is safe to erase all the IO's in a sector together. Table 3 below illustrates a particular example of the number of erase pulses at different drain and gate voltages for erasing a particular sector tested at different cycle intervals from one to 1000 program and erase cycles. As can be seen from Table 3 as the differential voltage between the gate and drain is increased the erase pulses necessary to erase the sector as the cycles increase becomes more constant. The best results were determined to be when the Vdrain is a substantially high positive voltage (e.g., 5.5–6 Volts) and when the absolute value of Vgate is a substantially high voltage (e.g., |Vg|>|−5.5|) where the voltage potential between Vdrain and Vgate was also substantially high (e.g., Vdiff>11 Volts).

TABLE 3

| | | ERASE PULSES | | | | |
|---|---|---|---|---|---|---|
| Vdrain (V) | Vgate (V) step to −6 v | cycle 1 | cycle 10 | cycle 100 | cycle 500 | cycle 1000 |
| 5 | Vg = −3 V | 40 | 85 | 430 | 700 | >1000 fail |
| | Vg = −4 V | 15 | 26 | 75 | 90 | 61 |
| | Vg = −5 V | 9 | 13 | 16 | 31 | 22 |
| | Vg = −6 V | 9 | 10 | 15 | 27 | 19 |
| 5.5 | Vg = −3 V | 9 | 19 | 45 | 37 | 50 |
| | Vg = −4 V | 4 | 5 | 10 | 15 | 9 |
| | Vg = −5 V | 3 | 4 | 6 | 6 | 6 |
| | Vg = −6 V | 4 | 4 | 4 | 4 | 4 |
| 6 | Vg = −3 V | 4 | 7 | 9 | 14 | 19 |
| | Vg = −4 V | 3 | 4 | 5 | 5 | 5 |
| | Vg = −5 V | 3 | 3 | 4 | 4 | 3 |
| | Vg = −6 V | 5 | 5 | 5 | 4 | 4 |

It was discovered that applying a large electric field on the first pulse to the normal bits improves the erase times by reducing the band to band current to less than 1/10 of its normal programmed state. For example, an electrical field of greater than 5.0 Megavolts/cm2 ((drain voltage+|gate voltage|)*100/Tox) may be utilized for long term stable erase over cycling. Furthermore, it was found after a 10 ms pulse is placed on each I/O of a sector for normal columns that the same electrical field can be used to continue the erase by applying 10 ms pulses to the normal bit locations of each I/O of the entire sector and then 1 ms pulses to the complimentary bit locations of each I/O of the entire sector. It was determined that this methodology provides for complete erasure of a sector having 524,288 cells in 2–5 pulses after the initial 10 ms pulses on each I/O for the sector.

Figure 14:
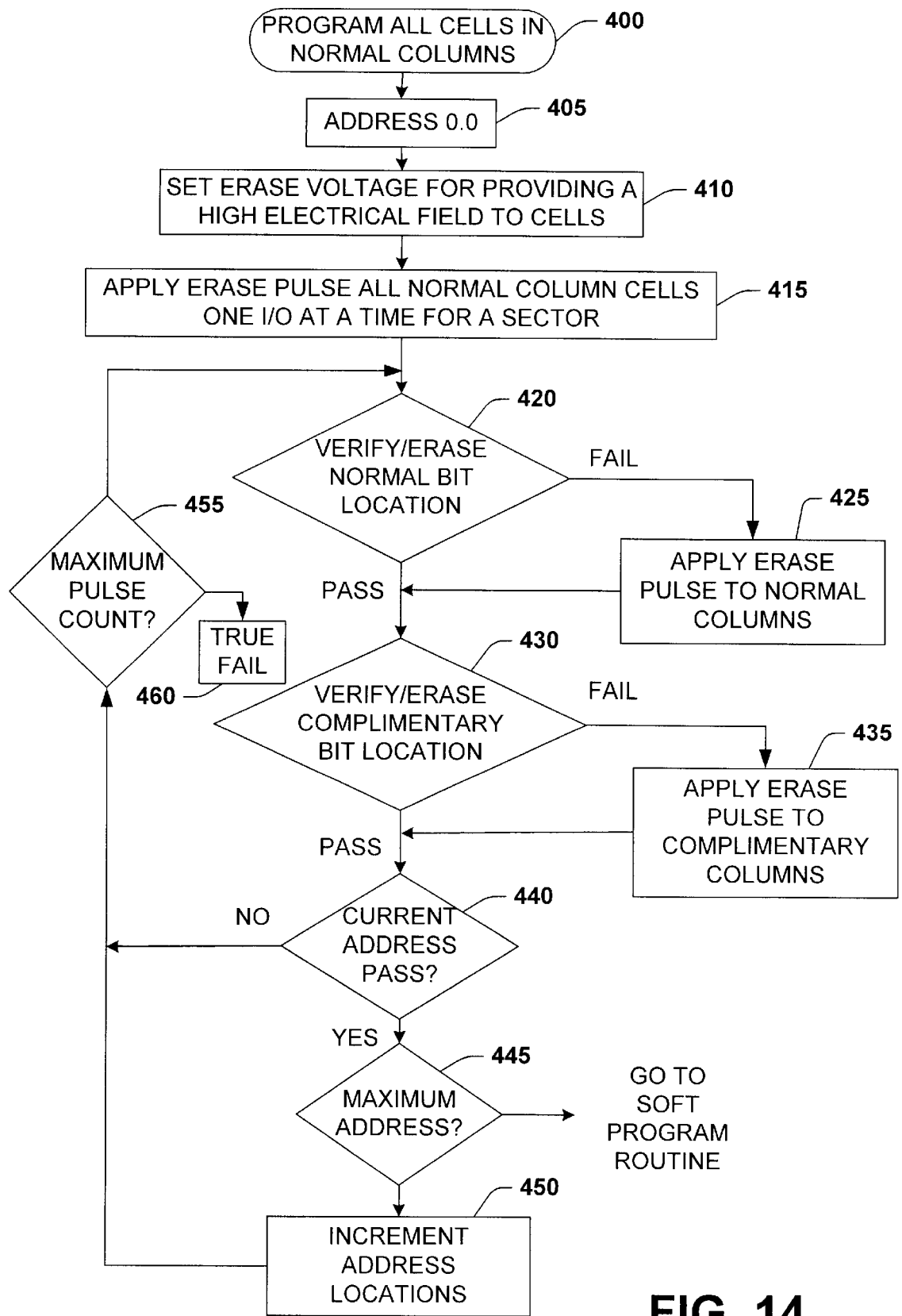
FIG. 14 is a flow diagram illustrating a methodology for erase verifying of an array of dual bit memory cells utilizing substantially high electric fields for erasure in accordance with an aspect of the invention.

FIG. 14 illustrates one particular methodology for performing a programming and erase utilizing a high electric field erase voltage for a memory array having dual bit cells operating in single bit mode in accordance with one aspect of the present invention. The method begins at step 400 were all normal columns are programmed to a delta VT. The method then advances to step 405 where the address counter is set to address 0.0. The methodology then proceeds to step 410. At step 410, an erase voltage is set for providing a high electrical field to memory cells in the array to reduce the band to band current in the programmed memory cells of the normal bits. At step 415, a differential voltage is applied across the gate and drain of each normal bit of an I/O of a sector one at a time for a duration of about 8–12 ms (e.g., 10 ms), until all normal bits in each sector have been provided with a high electrical field erase pulse. The method then proceeds to step 420.

Step 420 may be skipped on the first iteration of the verify erase and applications of erase pulses for the methodology of FIG. 14 because an erase pulse has already been provided to each normal column location at step 415. Alternatively, the verify erase may be performed and an erase pulse applied according to the flow chart of FIG. 14.

At step 420, the method performs a verify of the erase for each normal bit or I/O location in a sector. If the verify erase of a normal bit or I/O location fails, the methodology proceeds to step 425 and applies an erase pulse to the normal column locations of the sector. The methodology proceeds to step 430 and performs a verify erase of the complimentary bit or I/O location on the same transistor or I/O, respectively. If the verify erase of the complimentary bit fails, the methodology proceeds to step 435 and applies an erase pulse to the complimentary column locations of the sector. If the verify erase of the complimentary bit passes, the methodology proceeds to step 440 to determine if the current sector address has passed. If the current address has not passed (NO), the method proceeds to step 455 to determine if the maximum pulse count has been reached. If the maximum pulse count (e.g., 50 total pulses) has not been reached (NO), the method returns to step 420 to repeat the steps of verify the erase of the next normal and its complimentary bit and applying erase pulses if necessary. If the maximum pulse count has been reached (YES), a true failure is indicated in step 460. If the current address has passed at step 440 (YES), the method advances to step 445 to determine if the maximum sector address has been reached. If the maximum sector address has not been reached (NO), the address location of the address counter is moved to the next sector location at step 450 and the method returns to step 455. If the maximum sector address has been reached (YES) at step 445, the method advances to a soft program routine such as that illustrated in FIG. 10 to assure that the memory cells have not been over-erased.

A key characteristic of the dual bit memory cells in the flash memory array of the present invention is that the charge loss during accelerated high temperature bake (75–250° C.) is a strong function of the number of program and erase cycles. This presents a possible reliability issue since the amount of charge loss increases with cycling up to 10,000 program and erase cycles. The single bit one-zero or zero-one state (which occurs when one sides of the transistor is programmed and the other is blank or un-programmed) of the transistor shows this problem with increased charge loss with larger number of cycles. At 250° C. bake temperatures, the cell transistor behavior is not Guassian. At 250° C., the cell transistors near larger wordline (poly gates in core) gaps losses more charge due to redistribution of the charge in the nitride and the locally enhanced trapped nitride charge near the larger poly gaps. The charge loss distribution was found to be repeatable from die to die for the same data pattern for all devices cycled over the same number of cycles. The program and erase conditions during cycling appear to have little impact on the relationship of the charge loss versus number of cycles for cycling over 1000 cycles.

In order to account for the charge loss after 100 k cycles, the program delta VT (e.g., delta VT>2.5 volts) is increased to ensure valid VT of a programmed cell at the end of the life of the flash memory array. It was determined that the dual bit memory cell can be programmed to a higher VT (2.0–3.0 Volts) and with the higher gate and drain voltage while still maintaining very short programming times for single bit operation (e.g., 1 microsecond per word at Vgate=9.5–10.0 Volts and Vdrain=5.5–6.0 Volts). It was determined that the charge loss is a function of the number of PE cycles at the higher temperatures (e.g., 250° C.). The method of correcting for this type of cycling related charge loss was to program cells much harder (e.g., delta VT over 2.5 Volts). The use of very high drain and gate voltages can improve program times and was not found to degrade charge loss, which is most sensitive to a data pattern in the transistor of a one-zero or zero-one.

Figure 15:
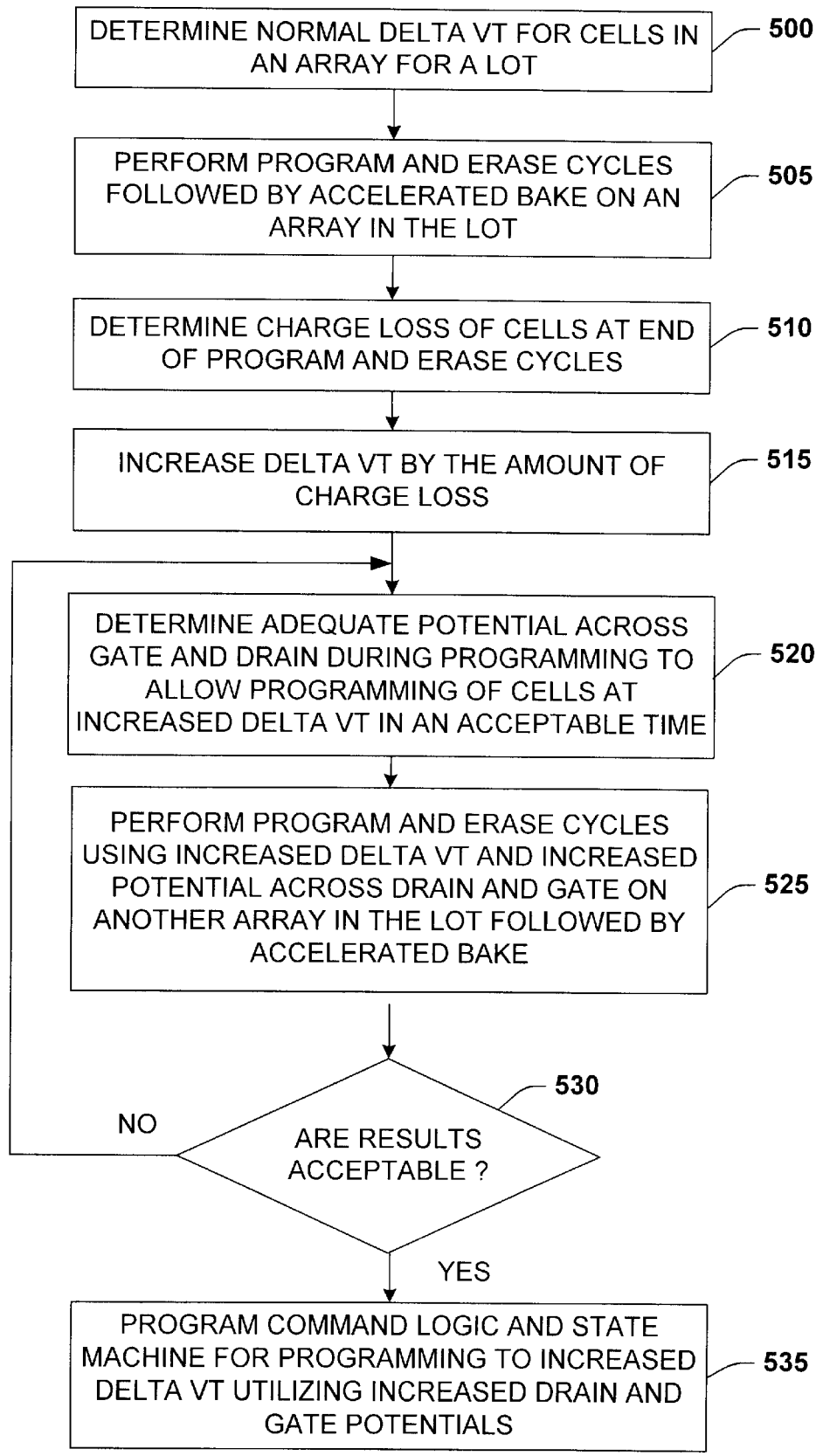
FIG. 15 is a flow diagram illustrating a methodology for determining a substantially high delta VT for programming normal bits of dual bit memory cells in accordance with an aspect of the invention.

FIG. 15 illustrates one particular methodology for determining a delta VT voltage for a dual bit memory cell of a memory array operating in single bit mode in accordance with one aspect of the present invention. The method begins at step 500 were a normal blank or un-programmed VT of the memory cells in an array for a lot is determined. At step 505, a number of program and erase cycles are performed on the array in the lot with various delta VT's for programming followed by a high temperature accelerated bake (100–250° C.). The charge loss of the cells is then determined, at step 510. At step 515, the delta programming VT is increased based on the amount of charge loss. At step 520, an adequate programming potential across the gate and drain is determined for programming the cells to the new delta VT in an acceptable amount of time. At step 525, program and erase cycles are performed on another array in the lot at the increased delta VT and the increased programming potential across the drain and gate of the memory cells followed by an accelerated bake. At step 530, the method determines if the results of the programming and erase cycles utilized in step 525 are acceptable. If the results of the programming and erase cycles are not acceptable (NO), the method returns to step 520. If the results of the programming and erase cycles are acceptable (YES), the command logic and state machine are programmed to program the normal bits of the dual bit memory cells utilizing the delta VT and the increased drain and gate potentials.

Figure 16:
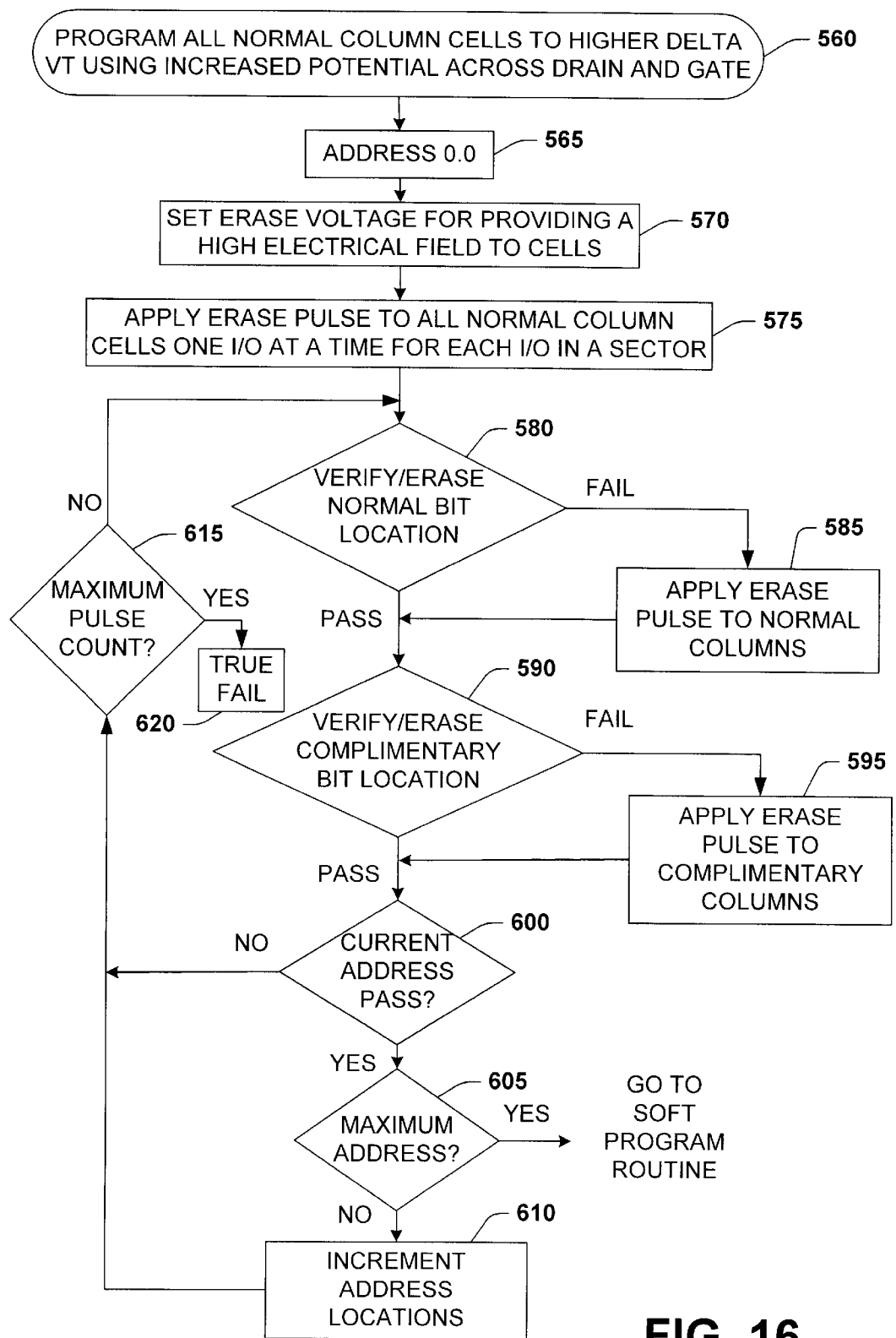
FIG. 16 is a flow diagram illustrating a methodology for erase verifying of an array of dual bit memory cells utilizing substantially high electric fields for erasure and a substantially high delta VT during programming in accordance with an aspect of the invention.

It is to be appreciated that programming using a higher delta VT can be utilized not only in normal programming conditions, but also for pre-programming or programming during the tailored erase methodology. FIG. 16 illustrates a methodology of utilizing the higher programming voltage of delta VT over natural VT of the memory cells and using an erase voltage for providing a higher electric field to the cells. The method begins at step 560 were all normal column cells are programmed at a higher delta VT (e.g., delta VT=2.0–3.0 Volts) over the natural VT of the cells using the increased voltages of the drain and gate (e.g., Vgate of 9.5 V to 10.0 V and a Vdrain of 5.5 V to 6.0 V). The method then advances to step 565 where the address counter is set to address 0.0. The methodology then proceeds to step 570. At step 570, an erase voltage is set for providing a high electrical field to memory cells in the array to erase the programmed memory cells of the normal bits. At step 575, a differential voltage is applied across the gate and drain of each normal bit for each I/O of a sector one I/O at a time for a duration of about 8–12 ms (e.g., 10 ms), until all normal bits in each sector have been provided with a high electrical field erase pulse. The method then proceeds to step 580.

Step 580 may be skipped on the first iteration of the verify erase and applications of erase pulses for the methodology of FIG. 16 because an erase pulse has already been provided to each normal column location at step 575. Alternatively, the verify erase may be performed and an erase pulses applied according to steps 580 and 585 of the flow chart of FIG. 16.

Referring again to the flow chart of FIG. 16, at step 580, the method performs a verify of the erase for each normal bit or I/O location in a sector. If the verify erase of a normal bit or I/O location fails, the methodology proceeds to step 585 and applies an erase pulse to the normal column locations of the sector. The methodology proceeds to step 590 and performs a verify erase of the complimentary bit location on the same transistor or I/O as the normal bit. If the verify erase of the complimentary bit fails, the methodology proceeds to step 595 and applies an erase pulse to the complimentary columns of the sector. If the verify erase of the complimentary bit or I/O location passes, the methodology proceeds to step 600 to determine if the current sector address has passed. If the current sector address has not passed (NO), the method proceeds to step 615 to determine if the maximum pulse count has been reached. If the maximum pulse count has not been reached (NO), the method returns to step 580 to repeat the steps of verifying the erase of the normal and complimentary bit or I/O locations and applying erase pulses if necessary. If the maximum pulse count has been reached (YES), a true failure is indicated in step 620. If the current address has passed at step 600 (YES), the method advances to step 605 to determine if the maximum sector address has been reached. If the maximum sector address has not been reached (NO), the address location of the address counter is moved to the next sector location at step 610 and the method returns to step 580 to repeat the steps of erase verifying the normal and complimentary bit or I/O locations and erase pulsing for the next sector. If the all sectors have been erased and the maximum sector address has been reached (YES) at step 605, the method advances to the soft program routine in FIG. 10 to ensure that the memory cells have not been over-erased.

Another characteristic of the flash memory array employing dual bit memory cells operating in single bit mode, is that charge loss is different at higher temperature than lower temperatures. Furthermore, charge loss at the higher temperatures is larger at the edge wordlines of blocks of cells (e.g., sectors) with large gaps between the blocks than the other cells in other wordlines. The higher charge loss may be a result of wider widths for the edge wordlines in the lithography process or in-process charging in the nitride extending between cells. Therefore, the different charge loss rate should be compensated for in applications where the flash memory array is utilized in higher temperatures.

One method of reducing the charge loss rate for the edge wordlines for blocks of cells is to minimize the gap between the blocks. This can be accomplished by adding a dummy wordline between the blocks, changing the wordline width for the last block or sector wordline, or using different nitride with less conductance in high temperature.

Figure 17:
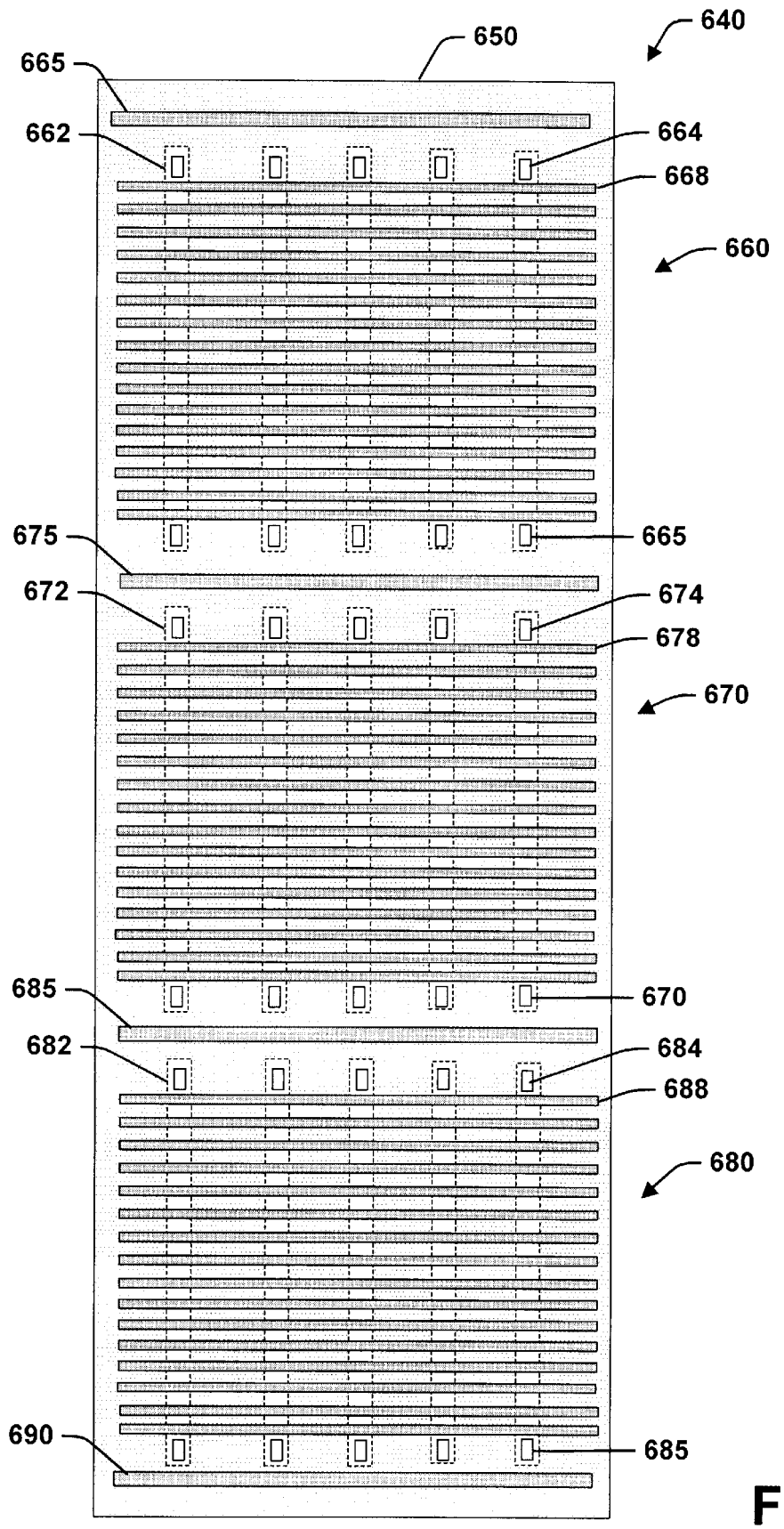
FIG. 17 illustrates a plan view of a sectors of an array of dual bit flash memory having dummy wordlines residing between large gaps in the blocks of memory in accordance with the present invention.

FIG. 17 illustrates a structure and method of adding dummy wordlines between the blocks of memory cells. A portion of a flash memory array 640 is illustrated with a first sector 660, a second sector 670 and a third sector 680 formed in an ONO stack layer 650 containing a plurality of dual bit memory cells adapted to operate in a single or double bit mode. Although the present example is illustrated with respect to sectors being formed from single blocks of 16 wordlines, it is to be appreciated that sectors are typically formed of several blocks of memory with contacts connecting to common metal bitlines and selection circuitry being provided between sectors. For example, blocks of 16 wordlines are typically used in a plurality to form a sector with 1 to 32 blocks. Therefore, the present example of FIG. 17 is for purposes of illustration and those skilled in the art would understand how to implement the present invention into a variety of different memory configurations.

The first sector 660 includes a plurality of wordlines 668 and a plurality of bitlines 662. Each bitline 662 includes a first contact 664 on a first end of the 16 wordlines 660 and a second contact 665 on a second end of the 16 wordlines 660. The second block of wordlines 670 includes a plurality of wordlines 678 and a plurality of bitlines 672. Each bitline 672 includes a first contact 674 on a first end of the block 670 and a second contact 675 on a second end of the block 670. The third sector 680 includes a plurality of wordlines 688 and a plurality of bitlines 682. Each bitline 682 includes a first contact 684 on a first end of the sector 680 and a second contact 685 on a second end of the sector 680. A first dummy wordline 665 is formed at the first end of the first 16 wordline block 660. A second dummy wordline 675 is placed between the first block 660 and the second wordline block 670. A third dummy wordline 675 is placed between the second block 670 and the third block 680 and a fourth dummy wordline 690 is placed at the second end of the third block 680.

The dummy wordlines are placed between the contacts to reduce the etch process charging in the nitride of the ONO stack 650. The dummy wordlines should be floated and are ignored during normal operations of the flash memory array, such as programming, verifying and erasing. Floating the dummy wordlines will allow the dummy wordlines to be shorted to the contact without causing electrical currents. Although the dummy wordlines are illustrated between sectors, dummy wordlines should be provided between any edge wordline located near a gap where the nitride in the ONO stack may store charge. For example, blocks may be grouped together forming sectors and large gaps can be located between sectors instead of between blocks.

Figure 18:
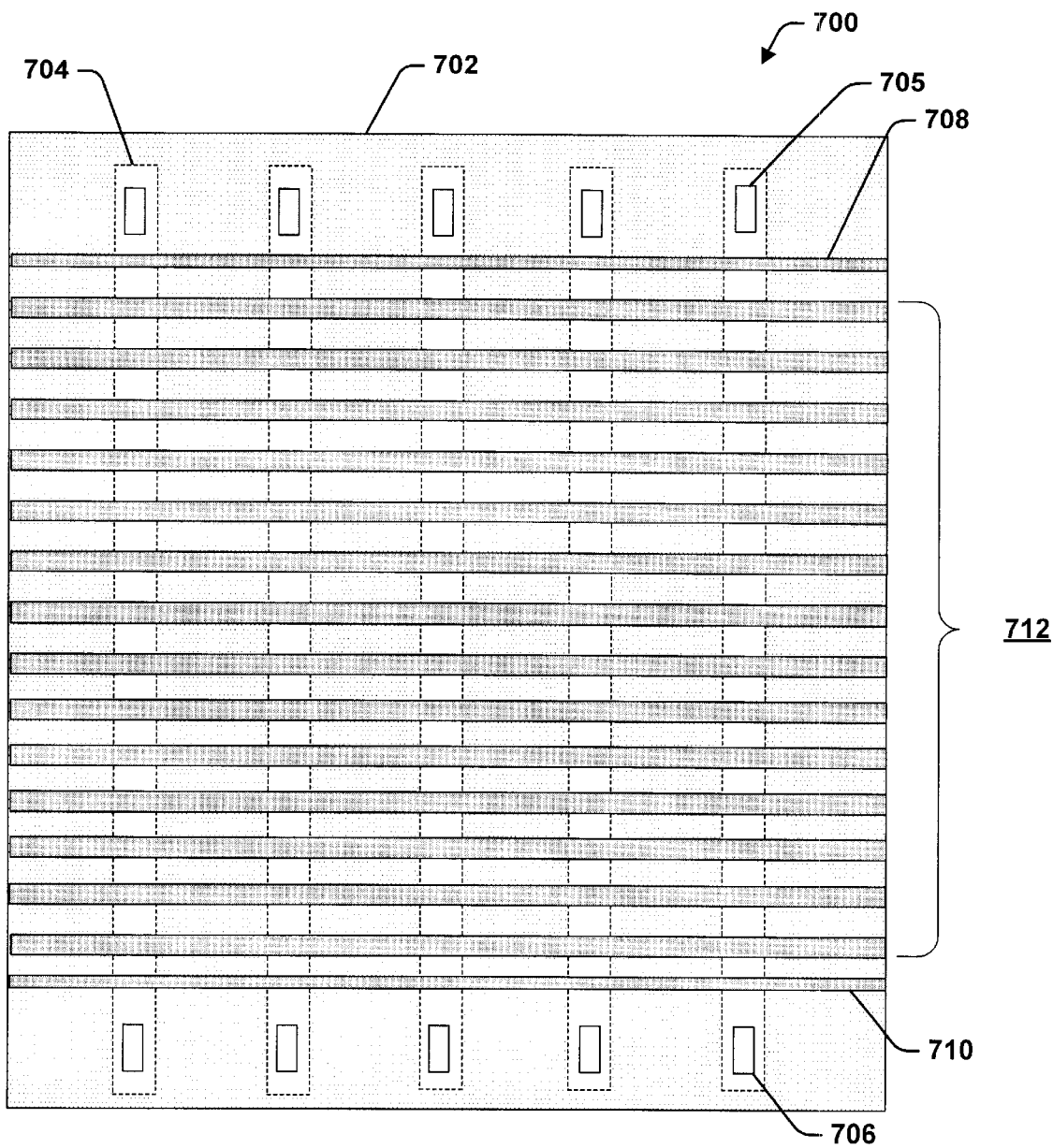
FIG. 18 illustrates a plan view of a sector of an array of dual bit flash memory having edge wordlines with a thickness that is less than a thickness of the remaining wordlines in accordance with the present invention.

FIG. 18 illustrates a structure and method of forming edge dummy wordlines that are thinner than the other wordlines in a block (or sector) of dual bit memory. Sixteen wordlines grouped in a block 700 is formed in an ONO stack layer 702 containing a plurality of dual bit memory cells adapted to operate in a single bit mode. The block 700 includes a plurality of wordlines 712 and a plurality of bitlines 704. Each bitline 704 includes a first contact 705 on a first end of the block 700 and a second contact 706 on a second end of the block 700. The block 700 includes a first edge wordline 708 on the first end of the block and a second edge wordline 710 on the second end of the block. The first and second edge wordlines 708 and 710 are fabricated with polysilicon and are formed with a width smaller than the remaining wordlines 712. The present example can also employ dummy wordlines. For example, the first edge wordline 708 and the second edge wordline 710 can be dummy wordlines with two additional wordlines added to the remaining wordlines 712 for a total of 16 remaining wordlines and 18 total wordlines. This type of dummy wordline should be programmed and erased with the other memory cells to avoid over-erase. During flash memory read operations the dummy wordline should be grounded.

Figure 19:
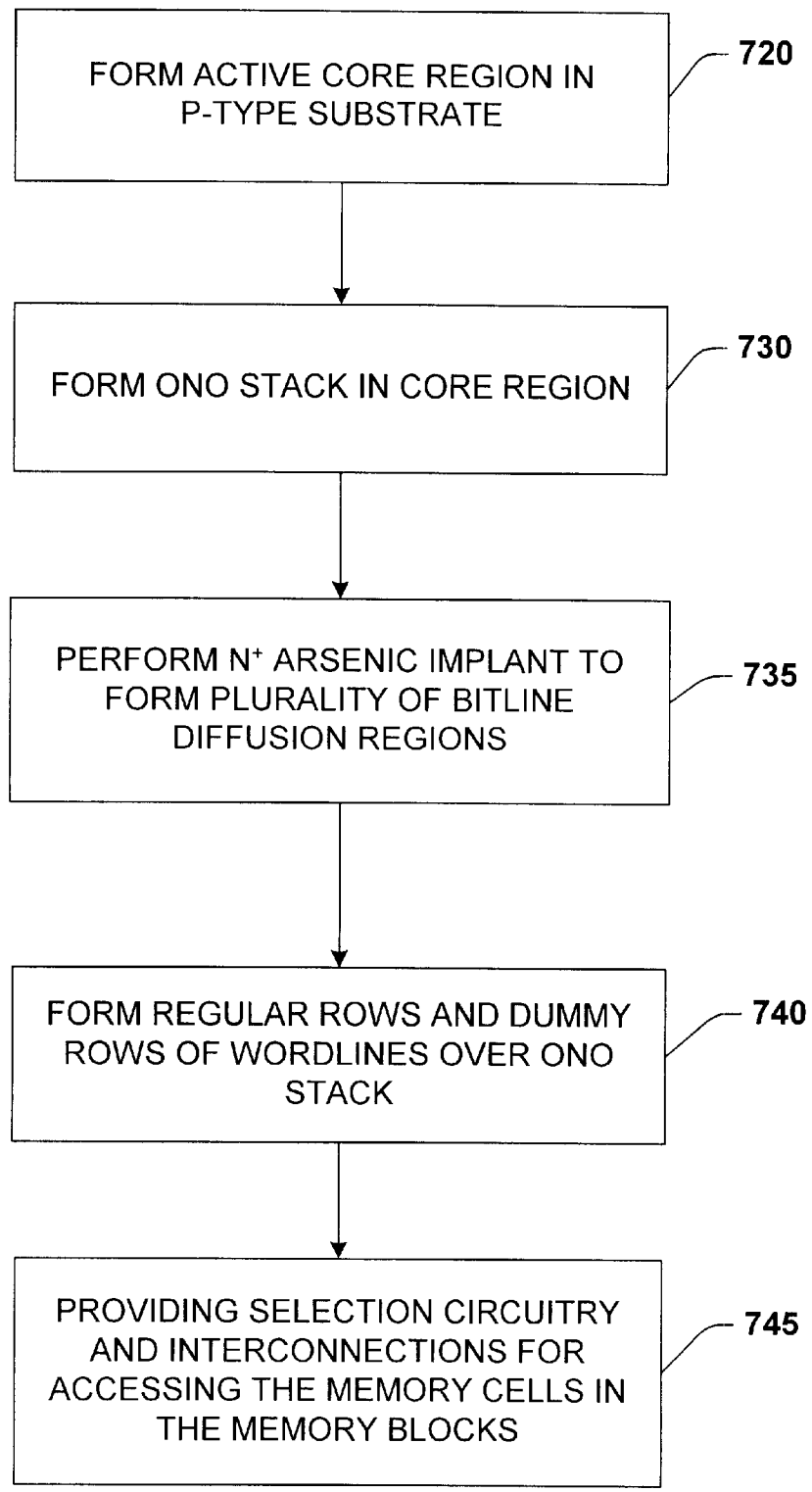
FIG. 19 is a flow diagram illustrating a methodology of fabricating an array of dual bit memory cells with dummy wordlines formed between gaps of transistor blocks in accordance with the present invention.

FIG. 19 illustrates one particular methodology for forming a memory array with dual bit memory cells including compensation for charges that may effect wordlines adjacent large gaps when the array is subjected to high temperatures. At step 720, an array active core region is formed and defined on a P-type substrate. At step 730, an ONO stack is formed over the core region. A plurality of dual bit transistors are formed by performing an $N^+$ arsenic implant forming bitline diffusion regions for an entire array of dual bit flash memory at step 735. At step 740, regular rows and dummy rows of wordlines are formed along rows of transistors gates over the ONO stack. Selection circuitry and interconnection circuitry is provided for allowing access to the memory cells in the memory blocks at step 745.

In a typical flash memory device, dummy columns are provided for fabrication purposes. The dummy columns include a plurality of inactive devices, which are ignored during programming, reading and the verification erasing algorithms. Another characteristic of a flash memory array with dual bit memory cells operating in single bit mode is the influence dummy columns on the programming and erase of the memory cells. For example, when the dummy column includes the complimentary bits to active transistors then the dummy column will buildup charge. This charge effects the capability and time required to erase the cells along the edge columns of the array. The problem can be compensated for by connecting dummy columns to the other memory devices in the sectors of the array and considering these dummy columns in the programming and the erase verify of the flash memory array. The true dummy columns (e.g., columns not part of active transistors) should be grounded on the end most columns. The columns next to active columns should be floated and/or programmed and erased during normal operations. Dummy column locations that are programmed are dumb programmed, which means they are given pulses without a verify sequence.

Figure 20:
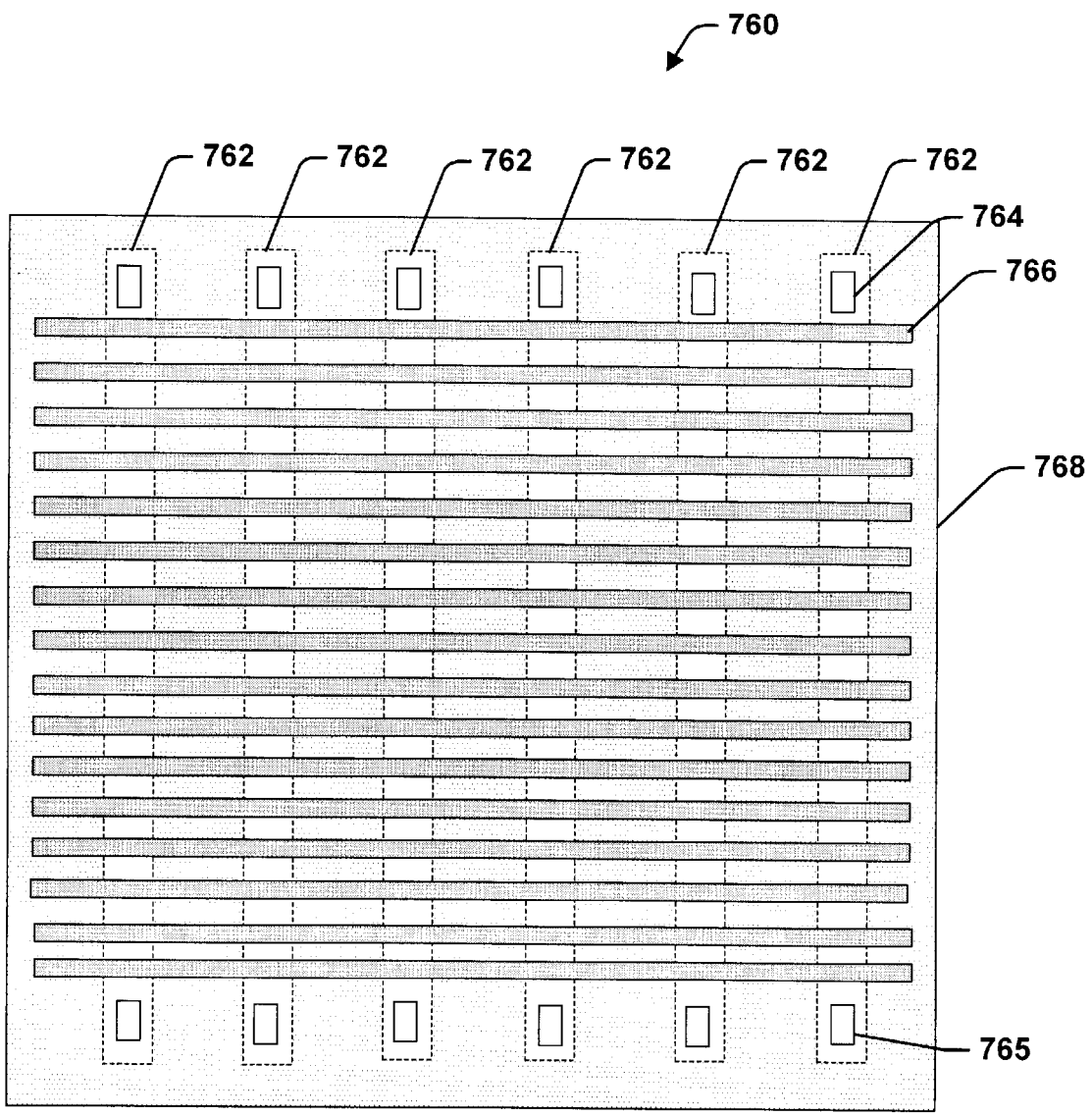
FIG. 20 illustrates a plan view of a sector of an array of dual bit flash memory adapted for treating columns of dummy memory cells similarly to actual used memory cells in accordance with the present invention.

FIG. 20 illustrates a block of 16 rows 760 which are formed in an ONO stack layer 768 containing a plurality of dual bit memory cells adapted to operate in a single bit mode. A typical sector will consist of several blocks of wordlines. The wordline block 760 includes a plurality of wordlines 766 and a plurality of bitlines 762. Each bitline within the block 762 includes a first contact 764 on the top of the block and a second contact 765 at the end of the block. The block 762 includes a first dummy column of dual bit memory transistor cells and a second dummy column of dual bit memory transistor cells on different sides of the block 762. An additional bitline and additional selecting transistors are employed to provide access to the first and second dummy columns, so that the transistors in the dummy columns can be treated similarly to other transistors in the sector.

Figure 21:
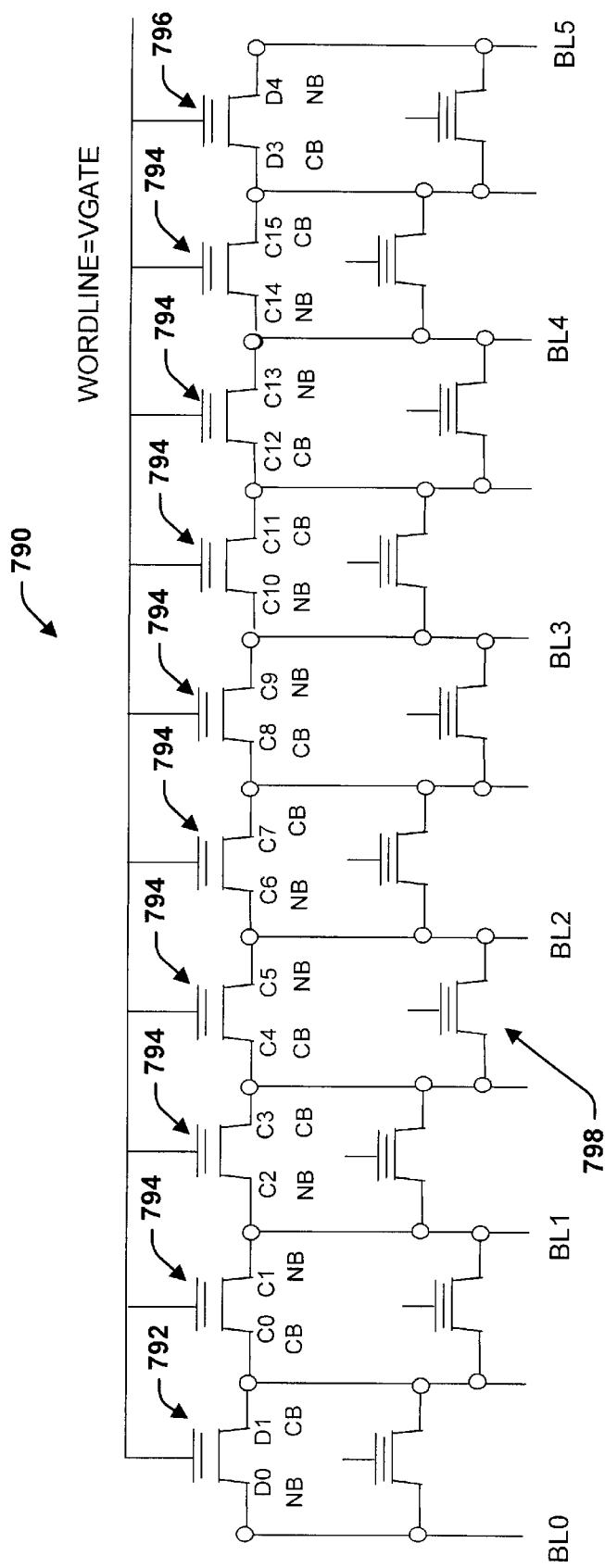
FIG. 21 illustrates a schematic view of connections of a row of actual used dual bit memory cells and dummy dual bit memory cells in accordance with the present invention.

FIG. 21 illustrates a block schematic diagram of the connections of the wordlines and bitlines for a row 790 of dual bit memory cells of the sector 760 including a first dummy cell 792 on a first end and a second dummy cell 796 on a second end of the row 790. The schematic is for purposes of illustration only for showing the connections of the dummy cells in the dummy columns. It is understood that the schematic illustrates an 8 bit word in single bit mode, while other applications may include 16, 32 or 64 bits per word. The row 790 includes a plurality of memory cells 794 forming the actual memory row of the device in addition to the first dummy dual bit transistor memory cell 792 and the second dummy dual bit transistor memory cell 796. The first dummy dual bit memory cell 792 includes a first bit D1, which is a normal bit and a second bit D2, which is a complimentary bit. The second dummy dual bit memory cell 796 includes a first bit D3, which is a complimentary bit and a second bit D4, which is a normal bit.

A wordline is connected to the gates of each transistor in the row. A bitline BL00 is connected to the bit D0 of dummy memory cell 792, a bitline BL1 is connected to bits C1 and C2, a bitline BL2 is connected to bits C5 and C6, a bitline BL3 is connected to bit C9 and C10, a bitline BL4 is connected to cells C13 and C14 and a bitline BL5 is connected to cell D4 of dummy memory cell 796. A plurality of selections transistors 798 are provided for allowing individual selections of the different cells. As can be seen from the schematic of FIG. 21, the dummy cells in the dummy columns are connected to the wordlines, bitlines and selection transistors 798 and can be treated like actual cells in the sector of the flash memory array 760. Therefore, during programming and erasing cycles, the dummy cells can be left grounded, floating, or also can be programmed and erased along with the actual cells in the memory.

Figure 22:
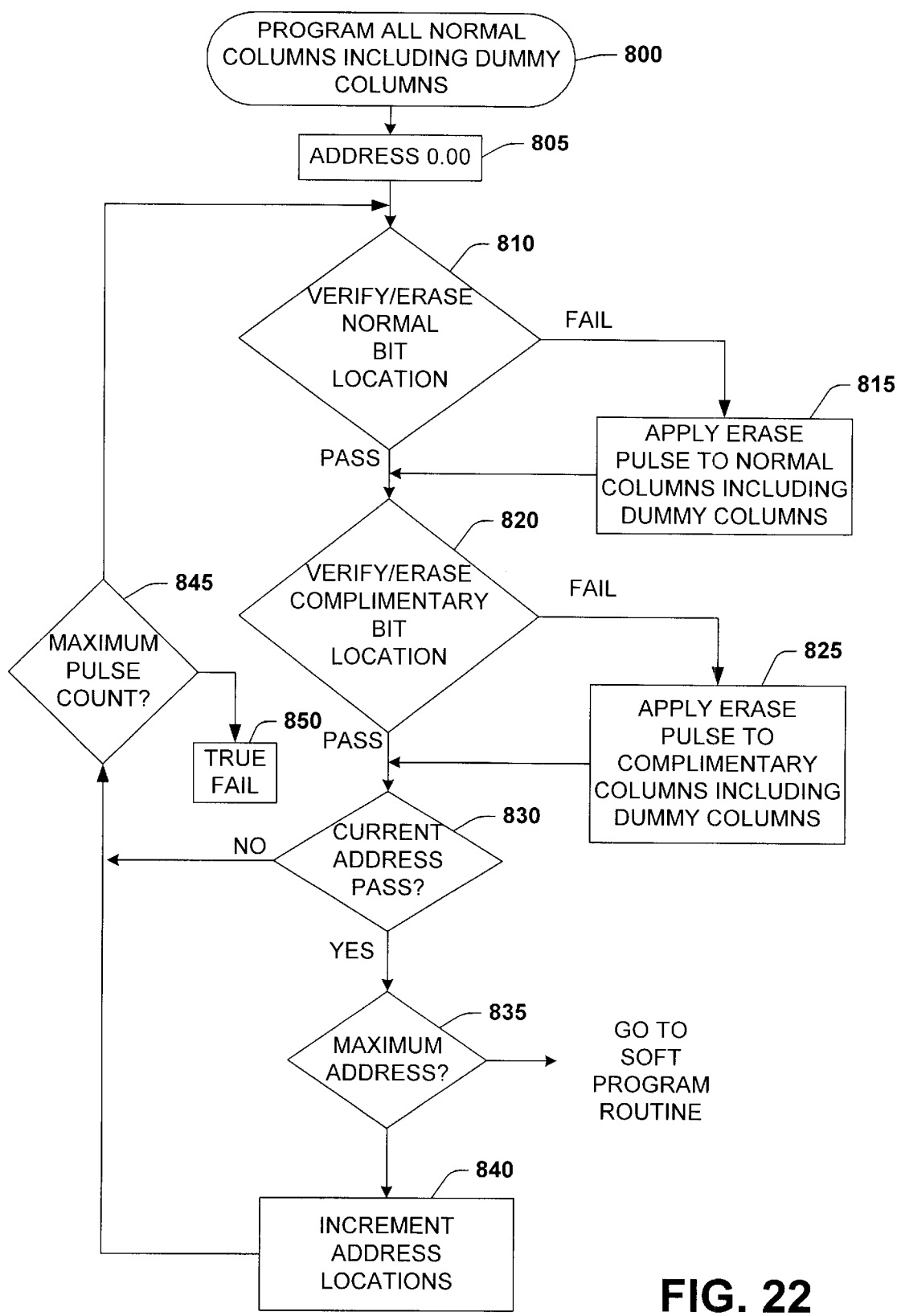
FIG. 22 is a flow diagram illustrating a methodology for erase verifying of an array of actual used dual bit memory cells and dummy memory cells in accordance with an aspect of the invention.

FIG. 22 illustrates one particular methodology for performing a programming and erase of a flash memory array having dual bit cells where the dummy column locations of the sectors are considered in accordance with one aspect of the present invention. The method begins at step 800 were all normal bit column locations are programmed including the dummy columns. Dummy column locations are dumb programmed which means they are given pulses without a verify sequence. The method then advances to step 805 where the address counter is set to address 0.0. The methodology then proceeds to step 810. At step 810, the method performs a verify of the erase for a normal bit location in a sector 760. Dummy columns are not included in the erase verify for normal or complimentary bit locations. If the verify erase of a normal bit location fails, the methodology proceeds to step 815 and applies an erase pulse to the normal column locations of the sector. The methodology proceeds to step 820 and performs a verify erase of a complimentary bit on the same transistor as the normal bit. If the verify erase of the complimentary bit location fails, the methodology proceeds to step 825 and applies an erase pulse to the complimentary column locations of the sector including all dummy columns.

If the verify erase of the complimentary bit location passes, the methodology proceeds to step 830 to determine if the current sector address has passed. If the current address has not passed (NO), the method proceeds to step 845 to determine if the maximum pulse count has been reached. If the maximum pulse count has not been reached (NO), the method returns to step 810 to repeat the steps of verify the erase of the normal and complimentary bit locations and applying erase pulses if necessary. If the maximum pulse count has been reached (YES), a true failure is indicated in step 850. If the current address has passed at step 830 (YES), the method advances to step 835 to determine if the maximum sector address has been reached. If the maximum sector address has not been reached (NO), the address location of the address counter is moved to the next sector location and the method returns to step 810 through 845 to repeat the steps of erase verifying the normal and complimentary bit locations for the next sector. If the all sectors have been erased and the maximum sector address has been reached (YES) at step 835, the method advances to the soft program routine in FIG. 10 to ensure that the memory cells have not been over-erased. The dummy columns are then considered in the soft programming routine as illustrated in FIG. 10 and the second block erase as illustrated in FIG. 11.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A method of erasing a dual bit memory cell adapted to operate in a single bit mode, the dual bit memory cell having a normal bit and a complimentary bit wherein only the normal bit is programmed during normal operation, comprising:

performing a first verification of whether a normal bit in a dual bit memory cell is properly erased;

applying an erase pulse to the normal bit in the dual bit memory cell if it is determined that the normal bit in the dual bit memory cell is not in a blank state;

performing a second verification of whether a complimentary bit associated with the normal bit in the dual bit memory cell is in a blank state; and applying an erase pulse to the complimentary bit in the dual bit memory cell if it is determined that the complimentary bit in the dual bit memory cell is not in the blank state.

2. The method of claim 1, the dual bit memory cell being an ONO dual bit memory cell.

3. The method of claim 1, further comprising repeating the steps of performing a first verification and applying an erase pulse to the normal bit and performing a second verification and applying an erase pulse to the complementary bit until both the normal bit and associated complimentary bit are in a blank state.

4. The method of claim 1, the step of applying an erase pulse to the normal bit comprising applying an erase pulse having a duration in the range of 8 to 12 ms and the step of applying an erase pulse to the complimentary bit comprising applying an erase pulse having a duration in the range of 0.5 to 2 ms.

5. The method of claim 1, the step of applying an erase pulse to the normal bit comprising applying an erase pulse having a substantially large electrical field.

6. The method of claim 5, the substantially large electric field being greater than 5.0 Megavolts/cm$^2$.

7. The method of claim 1, the step of applying an erase pulse to the normal bit comprising applying concurrently a voltage to a drain of the normal bit in the range of 5.5 to 6.0 volts and applying a voltage to a gate of the normal bit having a voltage in the range of −4.0 to −6.0 volts.

8. The method of claim 1, further comprising preprogramming the normal bit to a delta VT prior to the step of performing the first verification.

9. The method of claim 7, the delta VT being within a range of 2.0 to 3.0 volts.

10. The method of claim 7, the step of preprogramming the normal bit comprising applying a program pulse that concurrently applies a voltage in the range of 5.5 to 6.0 volts to the drain and a voltage in the range of 9.5 to 10.0 volts to the gate of the normal bit.

11. The method of claim 10, further comprising repeating the step of applying a program pulse until the delta VT of the normal bit is within the range of 2.0 to 3.0 volts.

12. The method of claim 1, further comprising verifying if the VT of the normal bit is below a minimum allowable VT for a blank state and applying a soft program pulse to the normal bit if the VT of the normal bit is below a minimum allowable VT for a blank state.

13. The method of claim 12, further comprising verifying if the VT of the complimentary bit is below a minimum allowable VT for a blank state and applying a soft program pulse to the complimentary bit if the VT of the complimentary bit is below a minimum allowable VT for a blank state.

14. The method of claim 13, further comprising verifying that the normal bit has a VT less than a maximum allowable VT for a blank state and applying an erase pulse to the normal bit if the VT of the normal bit is above a maximum allowable VT for a blank state.

15. The method of claim 14, further comprising verifying that the complimentary bit has a VT less than a maximum allowable VT for a blank state and applying an erase pulse to the complimentary bit if the VT of the complimentary bit is above a maximum allowable VT for a blank state.

16. A method for erasing an array of dual bit flash memory cells operating in a single bit mode, each of the dual bit memory cells having a normal bit and a complimentary bit wherein only the normal bit is programmed during normal operation, comprising:
performing a first verification on whether a normal bit location in a block of the array is in a blank state;
applying an erase pulse to bits in normal column locations of the block if it is determined that the normal bit location is not in a blank state;
performing a second verification of whether a complimentary bit location associated with the normal bit location is in a blank state; and
applying an erase pulse to the complementary bits in the complimentary column locations if it is determined that the complementary bit location is not in the blank state.

17. The method of claim 16, the array of dual bit flash memory cells being an array of ONO dual bit memory cells.

18. The method of claim 16, further comprising the steps of interleaving between performing the first verification and applying an erase pulse and the second verification and applying an erase pulse for consecutive normal bit locations and associated complimentary bit locations in the sector, until all of the normal and complimentary bits in the sector are in a blank state.

19. The method of claim 16, further comprising the steps of interleaving between performing the first verification and applying an erase pulse and the second verification and applying an erase pulse for each normal bit location and associated complimentary bit location for each sector in the array.

20. The method of claim 16, the step of applying an erase pulse to bits in the normal column locations comprising applying an erase pulse having a duration in the range of 8 to 12 ms and the step of applying an erase pulse to the bits in the complimentary column locations comprising applying an erase pulse having a duration in the range of 0.5 to 2 ms.

21. The method of claim 16, the step of applying an erase pulse to bits in the normal column locations comprising applying an erase pulse having a substantially large electrical field to each normal bit of an I/O, one I/O at a time, until each normal bit of the memory block has received an erase pulse.

22. The method of claim 21, the substantially large electric field being greater than 5.0 Megavolts/cm2.

23. The method of claim 21, the step of applying an erase pulse to normal column locations of the block comprising applying concurrently a voltage to a drain of each normal bit of an I/O for each I/O in the range of 5.5 to 6.0 volts and applying a voltage to a gate of each normal bit of an I/O for each I/O in the range of −4.0 to −6.0 volts.

24. The method of claim 16, further comprising preprogramming each normal bit of a block to a delta VT prior to the step of performing a first verification.

25. The method of claim 24, the delta VT being within a range of 2.0 to 3.0 volts.

26. The method of claim 24, the step of preprogramming each normal bit of a block comprising applying a pulse by concurrently applying a voltage to a drain of a normal bit of an I/O in the range of 5.5 to 6.0 volts and applying a voltage to a gate of the normal bit of the I/O in the range of 9.5 to 10.0 volts and repeating the step of applying a pulse for each bit of the block.

27. The method of claim 26, the pulse duration being about 1 microsecond.

28. The method of claim 16, further comprising the steps of interleaving between performing the first verification and applying an erase pulse and the second verification and applying an erase pulse for each normal bit location and associated complimentary bit location in the block, until each of the bits in the normal column locations and the complimentary column locations have a VT below a maximum allowable VT for a blank state.

29. The method of claim 28, further comprising verifying if the VT of the bits in the normal column locations are below a minimum allowable VT for a blank state and applying a soft program pulse to the bits in the normal column locations if the VT of any of the bits are below the minimum allowable VT for a blank state.

30. The method of claim 29, further comprising verifying if the VT of the bits in the complimentary column locations are above a minimum allowable VT defined for a blank state and applying a soft program pulse to the bits in the complimentary column locations if the VT of any of the bits are above the minimum allowable VT for a blank state.

31. The method of claim 30, further comprising repeating the steps of interleaving between performing the first verification and applying an erase pulse and the second verification and applying an erase pulse for each normal bit location and associated complimentary bit location in the sector if the soft program pulse has caused any of the bits to have a VT above the maximum allowable VT for a blank state.

32. The method of claim 16, the normal bit location and associated complimentary bit location being a single dual bit cell.

33. The method of claim 16, the normal bit location and associated complimentary bit location being a single word of dual bit cells.

34. A system for erasing an array of dual bit flash memory cells operating in a single bit mode, each of the dual bit flash memory cells having a normal bit and a complimentary bit wherein only the normal bit is programmed during normal operation, the system comprising:
an array of dual bit flash memory cells;
an address decoder component coupled to the array of dual bit flash memory cells, the address decoder component being adapted to provide access to a normal bit and a complimentary bit of each of the dual bit flash memory cells;
a voltage generator adapted to provide appropriate voltages for performing programming and erasure of normal bits and complimentary bits of the dual bit flash memory cells; and
a command logic component including a state machine, the command logic and state machine being coupled to the array and the address component and being operable to control the voltage generator, the command logic component and state machine being adapted to receive an erase command and execute an erase algorithm that programs normal bits of the memory cells and then interleaves between performing a first verification and erase on a normal bit location and a second verification and erase on a complimentary bit location associated with the normal bit location.

35. The system of claim 34, the array of dual bit flash memory cells being an array of ONO dual bit memory cells.

36. The system of claim 34, the command logic and state machine component being further operable to apply an erase pulse via the voltage generator to normal column locations for a duration having the range of 8–10 ms and to apply an erase pulse via the voltage generator to complimentary column locations for a duration having the range of 0.5–2 ms.

37. The system of claim 34, the command logic and state machine component being further operable to interleave between performing the first verification and applying an erase pulse and the second verification and applying an erase pulse for consecutive normal bit locations and associated complimentary bit locations in the block, until all of the normal and complimentary bits in the block are in a blank state.

38. The system of claim 37, the command logic and state machine component being further operable to interleave between performing the first verification and applying an erase pulse and the second verification and applying an erase pulse for each normal bit location and associated complimentary bit location for each block in the array.

39. The system of claim 34, the command logic and state machine component being further operable apply an erase pulse having a substantially large electrical field via the voltage generator to bits in the normal column locations to each normal bit of an I/O, one I/O at a time, until each normal bit of the memory block has received an erase pulse.

40. The system of claim 39, the substantially large electric field being greater than 5.0 Megavolts/cm2.

41. The system of claim 40, wherein the erase pulse applies a voltage to a drain of each normal bit of an I/O in the range of 5.5 to 6.0 volts and applies a voltage to a gate of each normal bit of the I/O in the range of −4.0 to −6.0 volts.

42. The system of claim 34, the command logic and state machine component being operable to program each normal bit of a block to a delta VT.

43. The system of claim 42, the delta VT being within a range of 2.0 to 3.0 volts.

44. The system of claim 42, wherein each normal bit of a block is programmed by applying a pulse via the voltage generator by concurrently applying a voltage to a drain of a normal bit of an I/O in the range of 5.5 to 6.0 volts and applying a voltage to a gate of the normal bit of the I/O in the range of 9.5 to 10.0 volts.

45. The system of claim 44, the pulse duration being about 1 microsecond.

46. The system of claim 34, the erase algorithm being further adapted to continue the interleaving of the first verification and erase on a normal bit location and a second verification and erase on a complimentary bit location associated with the normal bit location for every bit location in a block until all of the normal and complimentary bits in a block of memory have a VT below a maximum allowable VT for a blank state.

47. The system of claim 46, the erase algorithm being further operable to verify if the VT of the bits in the normal column locations are below a minimum VT defined for a blank state and apply a soft program pulse via the voltage generator to the bits in the normal column locations if the VT of any of the bits are below the minimum allowable VT for a blank state.

48. The system of claim 47, the erase algorithm being further operable to verify if the VT of the bits in the complimentary column locations are below a minimum VT defined for a blank state and apply a soft program pulse via the voltage generator to the bits in the complimentary column locations if the VT of any of the bits are below a minimum allowable VT for a blank state.

49. The system of claim 48, the erase algorithm being further adapted to repeat the interleaving of the first verification and erase on a normal bit location and a second verification and erase on a complimentary bit location associated with the normal bit location if any of the bits in the normal column locations and the complimentary column locations have a VT above the maximum allowable VT for a blank state caused by the soft program pulse.

50. The system of claim 34, the normal bit location and associated complimentary bit location being a single dual bit cell.

51. The system of claim 34, the normal bit location and associated complimentary bit location being a single word of dual bit cells.

52. A system for erasing an array of dual bit flash memory cells operating in a single bit mode, each of the dual bit flash memory cells having a normal bit and a complimentary bit wherein only the normal bit is programmed during normal operation, the system comprising:

means for selectively programming normal bits in the dual bit memory cell;

means for interleaving between performing a first verification and erase on a normal bit location and a second verification and erase on a complimentary bit location associated with the normal bit location for every bit location in at least one block of dual bit memory cells.

53. The system of claim 52, the means for selectively programming normal bits in the dual bit memory cell being adapted to program the normal bits to a delta VT within the range of 2.0 to 3.0 volts.

54. The system of claim 52, further comprising means for applying an erase pulse having a substantially large electrical field to each normal bit of an I/O, one I/O at a time, until each normal bit of the block has received an erase pulse.

55. The system of claim 52, further comprising means for determining if any of the normal and complimentary bits have been over-erased and means for soft programming the normal and complimentary bits that have been are over-erased.

56. The system of claim 55, further comprising means for determining that any of the normal and complimentary bits of the cell have been programmed by the means for selectively soft programming and means for selectively re-erasing any of the normal and complimentary bits that have been programmed.

* * * * *